US011943557B2

(12) United States Patent
Kim et al.

(10) Patent No.: US 11,943,557 B2
(45) Date of Patent: Mar. 26, 2024

(54) IMAGE SENSOR MODULE, IMAGE PROCESSING SYSTEM, AND OPERATING METHOD OF IMAGE SENSOR MODULE

(71) Applicant: Samsung Electronics Co., Ltd., Suwon-si (KR)

(72) Inventors: Byeoungsu Kim, Hwaseong-si (KR); Sangsoo Ko, Yongin-si (KR); Kyoungyoung Kim, Suwon-si (KR); Sanghyuck Ha, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 158 days.

(21) Appl. No.: 17/729,533

(22) Filed: Apr. 26, 2022

(65) Prior Publication Data
US 2022/0345592 A1    Oct. 27, 2022

(30) Foreign Application Priority Data

Apr. 27, 2021 (KR) .......................... 10-2021-0054523

(51) Int. Cl.
*H04N 5/222* (2006.01)
*H04N 23/45* (2023.01)
(Continued)

(52) U.S. Cl.
CPC .......... *H04N 5/2226* (2013.01); *H04N 23/45* (2023.01); *H04N 23/80* (2023.01); *H01L 27/14609* (2013.01)

(58) Field of Classification Search
CPC ...... H04N 5/2226; H04N 23/45; H04N 23/80; H01L 27/14609; G06V 10/16;
(Continued)

(56) References Cited

U.S. PATENT DOCUMENTS

| 5,673,120 A * | 9/1997 | Fujii ................... H04N 1/4051 358/444 |
| 6,415,038 B1 * | 7/2002 | Kaneko ................. H04N 1/407 702/32 |

(Continued)

OTHER PUBLICATIONS

Eddy Ilg, et al., "FlowNet 2.0: Evolution of Optical Flow Estimation with Deep Networks," Cornell University, Dec. 6, 2016.
(Continued)

*Primary Examiner* — Hung H Lam
(74) *Attorney, Agent, or Firm* — Harness, Dickey & Pierce, P.L.C.

(57) ABSTRACT

An image sensor module includes an image sensor configured to generate image data and memory including at least a memory bank storing the image data and a processor-in-memory (PIM) circuit, the PIM circuit including a plurality of processing elements. The memory is configured to read the image data from the memory bank; generate optical flow data and pattern density data using the plurality of processing elements, the optical flow data indicating time-sequential motion of at least one object included in the image data, and the pattern density data indicating a density of a pattern of the image data; and output the image data, the optical flow data, and the pattern density data.

20 Claims, 20 Drawing Sheets

(51) Int. Cl.
*H04N 23/80* (2023.01)
*H01L 27/146* (2006.01)
(58) Field of Classification Search
CPC ........ G06V 10/955; G06V 20/56; G06T 1/20; G06T 7/269; G06T 1/60; G06T 2207/10028; G06F 9/4411
See application file for complete search history.

(56) References Cited

U.S. PATENT DOCUMENTS

| | | | |
|---|---|---|---|
| 8,189,051 B2 | 5/2012 | Shih et al. | |
| 10,379,772 B2 | 8/2019 | Willcock et al. | |
| 10,839,266 B2 | 11/2020 | Kaminski et al. | |
| 10,878,583 B2 | 12/2020 | Schmid et al. | |
| 2018/0068451 A1* | 3/2018 | Leung | H04N 23/683 |
| 2019/0279374 A1* | 9/2019 | Kim | G06T 7/254 |
| 2020/0013184 A1 | 1/2020 | Linde et al. | |
| 2020/0160530 A1 | 5/2020 | Mehnert et al. | |
| 2020/0184655 A1* | 6/2020 | Xiang | H04N 23/64 |
| 2020/0396442 A1 | 12/2020 | Shin | |
| 2021/0004969 A1* | 1/2021 | Pourian | G06T 7/223 |
| 2021/0064913 A1 | 3/2021 | Ko et al. | |

OTHER PUBLICATIONS

Mark Sandler, et al., "MobileNetV2: Inverted Residuals and Linear Bottlenecks," Cornell University, Mar. 21, 2019.
Andrew Howard, et al., "Searching for MobileNetV3," Cornell University, Nov. 20, 2019.
M. Tan et al., "EfficientNet: Rethinking Model Scaling for Convolutional Neural Networks," Proceedings of the 36 th International Conference on Machine Learning, Sep. 11, 2020.
'Sony to Release World's First Intelligent Vision Sensors with AI Processing Functionality' News Releases, May 14, 2020, pp. 1-8, <https://www.sony.net/SonyInfo/News/Press/202005/20-037E/>.
Arush, 'Part 2—The Math Behind Optical Flow' Software for Autonomous Aerospace, May 17, 2020, pp. 1-4, <https://medium.com/building-autonomous-flight-software/math-behind-optical-flow-1c38a25b1fe8>.
J. Sardinha, 'Predicting vehicle speed from dash cam video' Weights and Biases, Aug. 30, 2017, pp. 1-9, <https://medium.com/weightsandbiases/predicting-vehicle-speed-from-dashcam-video-f6158054f6fd>.
Y. T. Liu, 'The Ultimate Guide to Video Object Detection' Towards Data Science, May 13, 2020, pp. 1-12, <https://towardsdatascience.com/ug-vod-the-ultimate-quide-to-video-object-detection-816a76073aef>.
T. Haruta et al. 'A 1/2.3inch 20Mpixel 3-Layer Stacked CMOS Image Sensor with DRAM' ISSCC 2017 / Session 4 / Imagers / 4.6, *IEEE International Solid-State Circuits Conference*, Feb. 6, 2017, pp. 76-78.
D. James et al. 'Sony Launches First Three-Layer, 960 fps Camera with Sandwich-Stacked DRAM' May 2, 2017, <https://www.techinsights.com/blog/sony-launches-first-three-layer-960-fps-camera-sandwich-stacked-dram>.

* cited by examiner

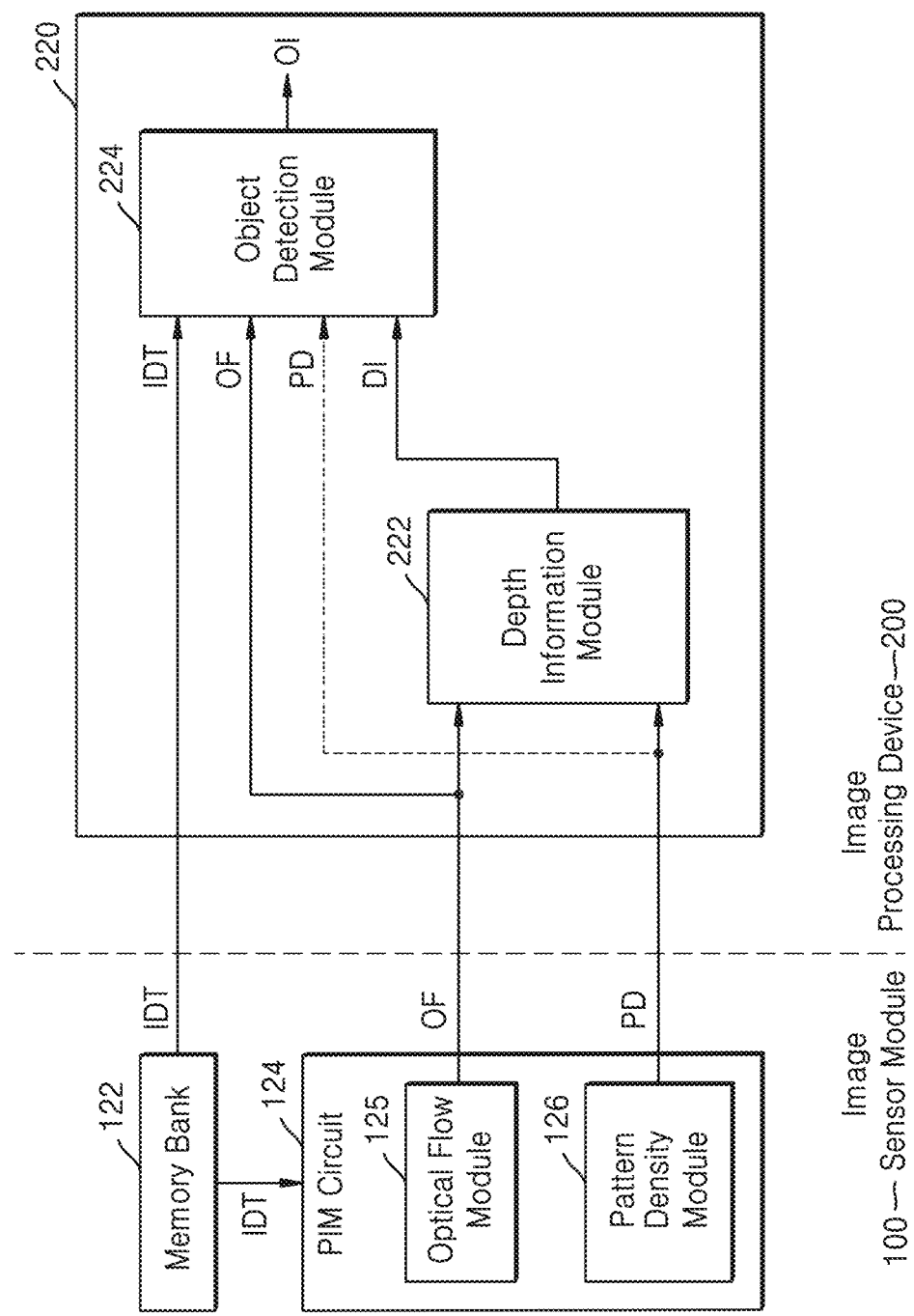

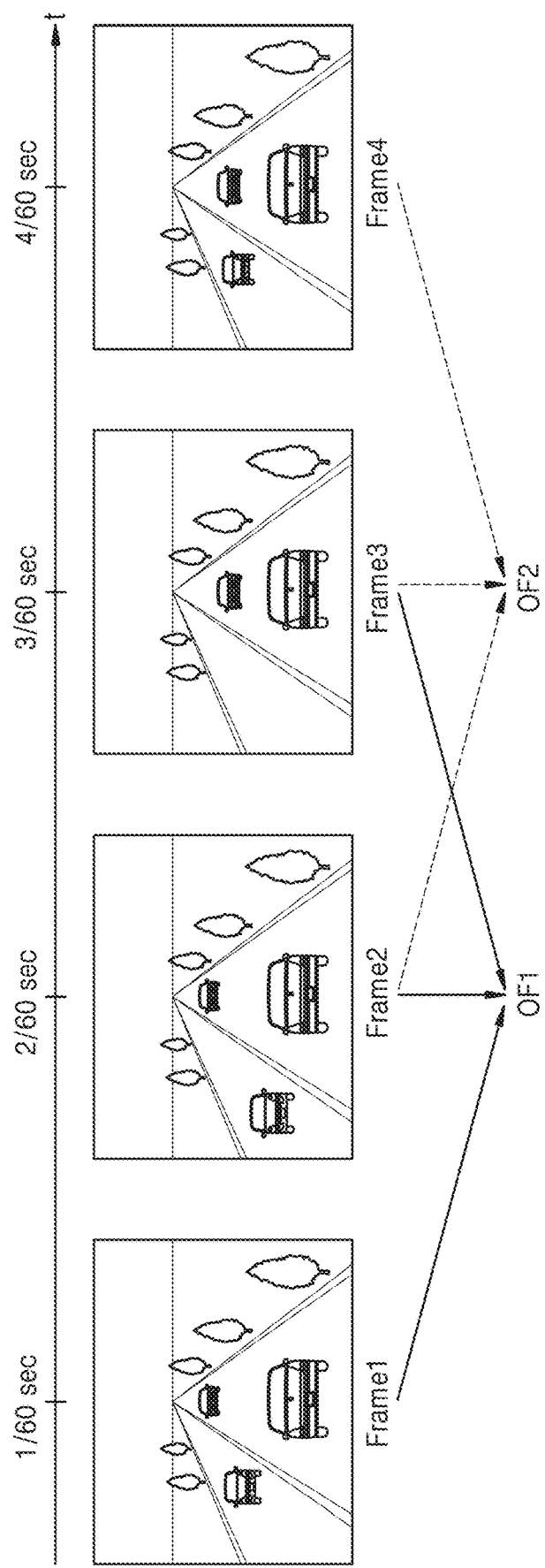

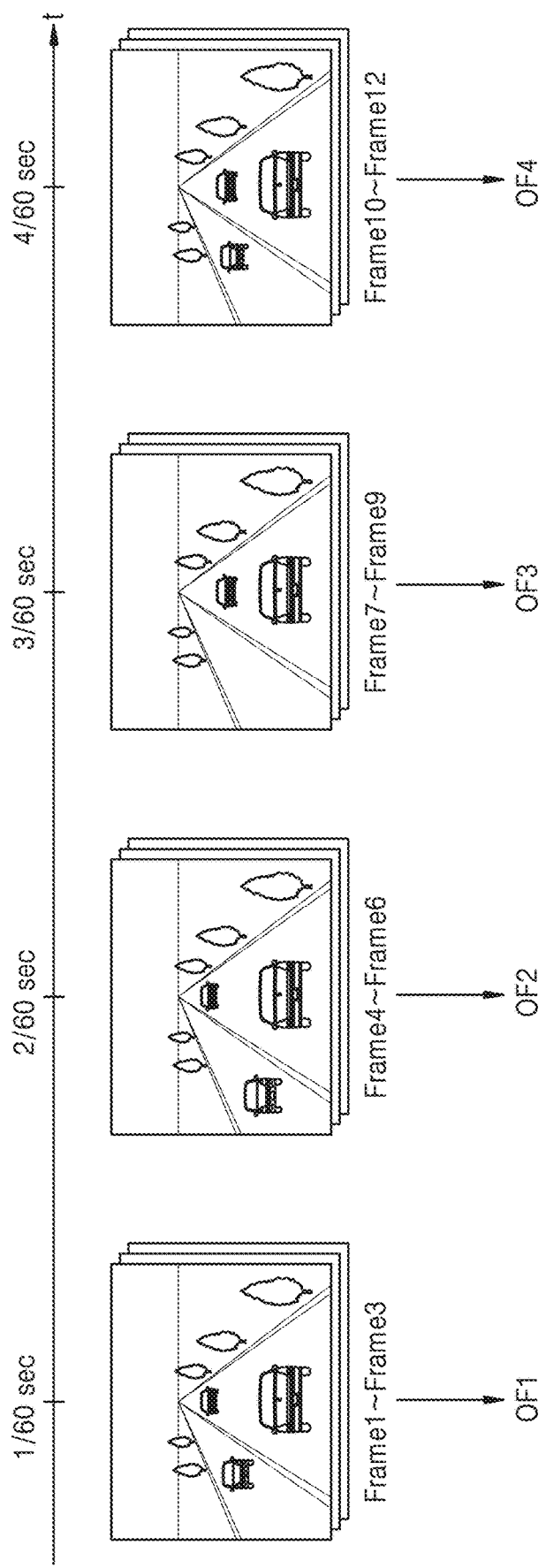

IMAGE SENSOR MODULE, IMAGE PROCESSING SYSTEM, AND OPERATING METHOD OF IMAGE SENSOR MODULE

CROSS-REFERENCE TO RELATED APPLICATION

This application is based on and claims priority under 35 U.S.C. § 119 to Korean Patent Application No. 10-2021-0054523, filed on Apr. 27, 2021, in the Korean Intellectual Property Office, the disclosure of which is incorporated by reference herein in its entirety.

BACKGROUND

The inventive concepts relate to an image sensor module, an image processing system, and an operating method of the image sensor module, and more particularly, to an image sensor module including a memory performing a calculation process, an image processing system, and an operating method of the image sensor module.

Image sensors can capture two-dimensional (2D) and/or three-dimensional (3D) images, e.g., of an object. Image sensors can generate an image of the object using a photo-electric conversion element, which reacts to the intensity of light reflected and/or otherwise emitted from the object. With the recent development of complementary metal-oxide semiconductor (CMOS) technology, a CMOS image sensor using CMOS has been widely used.

With the recent increasing demand for high-quality and high-definition photographs and images, the size of image data generated by image sensors is increasing. When the size of image data increases, a high bandwidth is necessary for smooth calculation processing of, e.g., the image data.

For example, an advanced drivers assistance system (ADAS) using an image sensor requires an increase in accuracy of object detection and real-time execution of object detection to secure safety. The accuracy of object detection may be ensured through high-resolution image data, and the real-time execution of object detection may be ensured through a high bandwidth and high calculation performance.

SUMMARY

The inventive concepts provide an image sensor module including a memory performing a calculation process, an image processing system, and an operating method of the image sensor module.

According to an aspect of the inventive concepts, there is provided an image sensor module including an image sensor configured to generate image data and memory including at least a memory bank storing the image data and a processor-in-memory (PIM) circuit, the PIM circuit including a plurality of processing elements, and the memory is configured to read the image data from the memory bank, generate optical flow data and pattern density data using the plurality of processing elements, the optical flow data indicating time-sequential motion of at least one object included in the image data, and the pattern density data indicating a density of a pattern of the image data, and output the image data, the optical flow data, and the pattern density data.

According to another aspect of the inventive concepts, there is provided an image processing system including an image sensor module and an image processing device, the image sensor module including an image sensor configured to generate image data; and memory configured to generate optical flow data and pattern density data using a processor-in-memory (PIM) circuit, the optical flow data indicating time-sequential motion of at least one object included in the image data, and the pattern density data indicating a density of a pattern of the image data, and the image processing device is configured to perform object detection on the image data based on the image data, the optical flow data, and the pattern density data.

According to a further aspect of the inventive concepts, there is provided an operating method of a module including an image sensor and memory. The operating method includes obtaining image data using the image sensor; storing the image data in a plurality of banks included in the memory; generating optical flow data with respect to the image data using processing elements included in the memory; generating pattern density data with respect to the image data using the processing elements included in the memory; and outputting the image data, the optical flow data, and the pattern density data.

BRIEF DESCRIPTION OF THE DRAWINGS

Example embodiments of the inventive concepts will be more clearly understood from the following detailed description taken in conjunction with the accompanying drawings in which:

FIGS. 4A and 4B are block diagrams for describing operations of an image sensor module and an image processing device, according to some example embodiments;

FIGS. 6A and 6B are diagrams for describing a method of generating optical flow data according to a shooting mode of an image sensor module, according to some example embodiments;

DETAILED DESCRIPTION OF THE EMBODIMENTS

Figure 1:
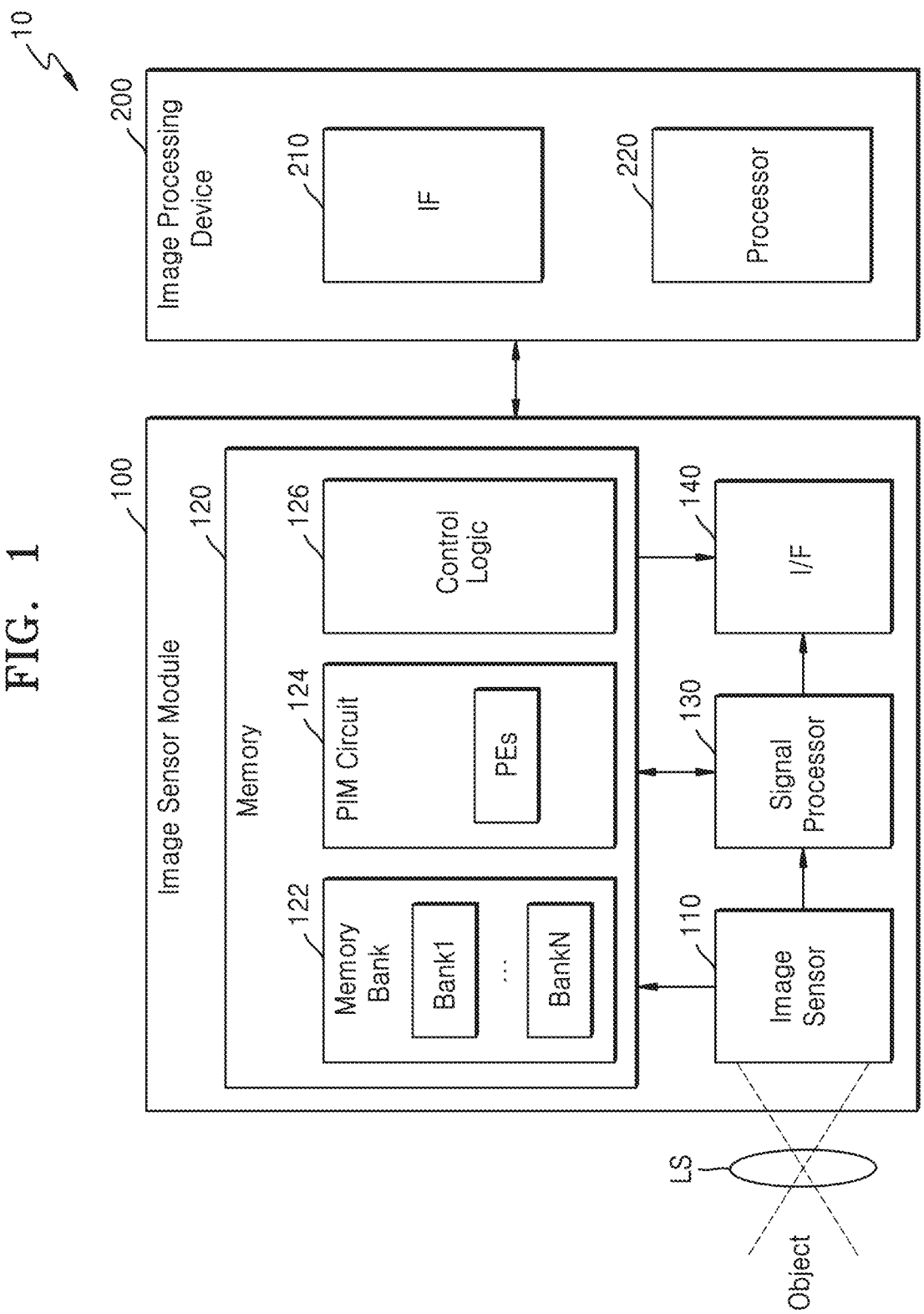
FIG. 1 is a block diagram of an image processing system according to some example embodiments.

Hereinafter, example embodiments will be described in detail with reference to the accompanying drawings, wherein like reference numerals refer to like elements throughout.

Although the terms "first," "second," "third," etc., may be used herein to describe various elements, components, regions, layers, and/or sections, these terms are only used to distinguish one element, component, region, layer, or section, from another region, layer, or section. Thus, a first element, component, region, layer, or section, discussed below may be alternatively termed a second element, component, region, layer, or section, without departing from the scope of this disclosure. Additionally, when an element is referred to as being "on," "connected to," "coupled to," or "adjacent to," another element, the element may be directly on, connected to, coupled to, or adjacent to, the other element, or one or more other intervening elements may be present.

FIG. 1 is a block diagram of an image processing system according to some example embodiments.

Referring to FIG. 1, an image processing system 10 may include an image sensor module 100 and an image processing device 200. For example, the image processing system 10 may include and/or be included in, e.g., a personal computer, an Internet of things (IoT) device, and/or a portable electronic device. The portable electronic device may include, e.g., a laptop computer, a cellular phone, a smartphone, a tablet personal computer (PC), a personal digital assistant (PDA), an enterprise digital assistant (EDA), a digital still camera, a digital video camera, an audio device, a portable multimedia player (PMP), a personal navigation device (PND), an MP3 player, a handheld game console, an e-book, a wearable device, and/or the like. The image processing system 10 may be mounted on and/or in an electronic device, such as a drone and/or an advanced driver's assistance system (ADAS); and/or on (and/or in) an electronic device provided as a component of an electronic vehicle, furniture, a manufacturing facility, a door, and/or various kinds of measuring equipment.

The image sensor module 100 may sense an object as an image, process the sensed image and/or store the sensed image in a memory, and store the processed image in the memory. In some embodiments, the image sensor module 100 may include an image sensor 110, a memory 120, a signal processor 130, and an interface 140. In some example embodiments, the image sensor module 100 may be implemented in and/or include a plurality of semiconductor chips. However, embodiments are not limited thereto, and the image sensor module 100 may be implemented in and/or include a single semiconductor chip.

The image sensor module 100 may capture an external object and generate image data. For example, the image sensor 110 of the image sensor module 100 may convert an optical signal of an object, which is incident through a lens LS, into an electrical signal. The image sensor 110 may include a pixel array, in which a plurality of pixels are arranged in two (or more) dimensions, and output image data, which includes a plurality of pixel values corresponding to the respective pixels of the pixel array.

The pixel array may include a plurality of row lines, a plurality of column lines, and a plurality of pixels arranged in a matrix, each of the pixels being connected to one of the row lines and one of the column lines. Each of the pixels may include at least one photoelectric conversion element (and/or photosensitive device). The photoelectric conversion element may sense light and convert the light into a photocharge. For example, the photoelectric conversion element may include a photosensitive device, such as an inorganic photodiode, an organic photodiode, a Perovskite photodiode, a phototransistor, a photogate, a pinned photodiode, which includes an organic or inorganic material, and/or the like. In some example embodiments, each of the pixels may include a plurality of photoelectric conversion elements.

In some example embodiment, image data generated by the image sensor 110 may include raw image data, which includes a plurality of pixel values resulting from digital-to-analog conversion of a plurality of pixel signals output from the pixel array, and/or image data obtained by pre-processing the row image data.

In some example embodiments, the image sensor 110 may include a drive and read circuit, which controls the pixel array and converts pixel signals received from the pixel array into pixel values. For example, the drive and read circuit may include a row driver, a readout circuit, a ramp signal generator, a timing controller, and/or the like. The drive and read circuit may generate raw image data including pixel values corresponding to the received pixel signals. In some example embodiments, the image sensor 110 may further include a processing logic, which pre-processes raw image data. The image sensor 110 may transmit the raw image data and/or pre-processed image data to the memory 120 and/or the signal processor 130.

The memory 120 may include a memory bank 122, a processor-in-memory (PIM) circuit 124, and a control logic 126. The memory bank 122 may include a plurality of banks Bank1 through BankN. Each of the banks Bank1 through BankN may include a memory cell array including a plurality of memory cells. A bank may be variously defined. For example, a bank may be defined as a configuration including memory cells and/or a configuration including memory cells and at least one peripheral circuit.

The memory 120 may store image data generated by the image sensor 110 and/or image data processed by the signal processor 130. In some example embodiments, the memory bank 122 may store the image data received from the image sensor 110 and/or the signal processor 130 in at least one of the banks Bank1 through BankN. The memory bank 122 may read image data stored therein under the control of the image sensor module 100 and transmit the image data to the signal processor 130 and/or the interface 140.

The memory 120 may perform a calculation process on the image data, e.g., received from the image sensor 110 and/or the image data stored therein, using the PIM circuit 124. In some example embodiments, the PIM circuit 124 may perform calculation processes related with various kinds of image processing operations using processing elements PEs.

In some example embodiments, the PIM circuit 124 may perform various image processing operations, such as an operation using, e.g., an image enhancement algorithm, a classification operation, and/or a segmentation operation, e.g., on image artifacts of image data. For example, operations using an image enhancement algorithm may include white balancing, de-noising, de-mosaicking, re-mosaicking, lens shading, and/or gamma correction, but are not limited thereto.

According to some example embodiment, the PIM circuit 124 may perform, as an example image processing operation, a pattern density detection operation, in which the pattern of a plurality of image regions of image data is analyzed and pattern density data of the image data is generated and/or the PIM circuit 124 may perform an optical flow detection operation, in which a plurality of frames of image data are analyzed and optical flow data indicating the time-sequential motion of an object between the frames is generated.

In some example embodiments, the image processing operation may be implemented by neural network-based tasks, and the PIM circuit 124 may perform at least some neural network-based calculation processes. For example, in some embodiments, the PIM circuit 124 may include (and/or be included in) a neural network processing unit (NPU). A neural network may include a neural network model based on at least one selected from an artificial neural network (ANN), a convolution neural network (CNN), a region with CNN (R-CNN), a region proposal network (RPN), a recurrent neural network (RNN), a stacking-based deep neural network (S-DNN), a state-space dynamic neural network (S-SDNN), a deconvolution network, a deep belief network (DBN), a restricted Boltzmann machine (RBM), a fully convolutional network, a long short-term memory (LSTM) network, a classification network, a plain residual network, a dense network, a hierarchical pyramid network, a fully convolutional network, and/or the like. For example, the kinds of neural network models are not limited to those above. A method, performed by the PIM circuit 124, of performing a neural network-based calculation process will be described in detail with reference to FIG. 2.

In some example embodiments, the processing elements PEs of the PIM circuit 124 may read image data from the banks Bank1 through BankN of the memory bank 122 and perform an image processing operation (e.g., at least one of the image processing operations described above) on the image data. The memory 120 may store image data, on which a calculation process has been performed using the PIM circuit 124, and/or calculation data, which has been generated through the calculation process, in the memory bank 122. The memory 120 may also provide the image data that has undergone a calculation process and/or the calculation data to the signal processor 130. The memory 120 may also output the image data that has undergone a calculation process and/or the calculation data to an external device of the image sensor module 100 through the interface 140.

The control logic 126 may control the memory bank 122 and the PIM circuit 124. In some example embodiments, the control logic 126 may decode a command and an address, which are provided to the memory 120, and control the memory bank 122 and the PIM circuit 124 such that a memory operation is performed according to a decoding result. For example, commands provided to the memory 120 may include a command related with a memory operation such as a data write or read operation and a command related with a calculation operation. The control logic 126 may include (and/or be included in) processing circuitry, such as hardware including logic circuits; a hardware/software combination such as a processor executing software; and/or a combination thereof. The control logic 126 may control the memory bank 122 to perform a memory operation of writing or reading data on a storage region corresponding to an address according to the decoding result and/or control the PIM circuit 124 to perform a calculation operation based on data written to a storage region corresponding to an address.

The memory 120 may include dynamic random access memory (DRAM) such as double data rate (DDR) synchronous DRAM (SDRAM), low power DDR (LPDDR), synchronous DRAM (SDRAM), graphics DDR (GDDR), Rambus DRAM (RDRAM), and/or the like. However, example embodiments are not limited thereto. For example, a memory device may include non-volatile memory such as flash memory, magnetic RAM (MRAM), ferroelectric RAM (FeRAM), phase-change RAM (PRAM), and/or resistive RAM (ReRAM).

The memory 120 may correspond to a single semiconductor chip and/or may correspond to a single channel in a memory device, which includes a plurality of channels each having an independent interface. The memory 120 may correspond to a memory module and/or correspond to a single memory chip mounted on a module board when a memory module may include a plurality of chips.

The signal processor 130 may perform a calculation process on image data received from the image sensor 110 and/or the memory 120. For example, the signal processor 130 may include a central processing unit (CPU), a microprocessor, and/or a microcontroller unit (MCU). In some example embodiments, the signal processor 130 may perform calculation processes related with various kinds of image processing operations. For example, like the PIM circuit 124 of the memory 120, the signal processor 130 may perform various image processing operations, such as white balancing, de-noising, de-mosaicking, re-mosaicking, lens shading, gamma correction, a classification operation, a segmentation operation, and/or the like.

For example, in some example embodiments, the signal processor 130 may receive image data, on which a certain image processing operation has been performed by the memory 120, and perform other image processing operations on the received image data. For example, the signal processor 130 may receive image data, on which de-noising has been performed by the memory 120, and perform at least one selected from white balancing, de-mosaicking, re-mosaicking, lens shading, gamma correction, a classification operation, and/or a segmentation operation on the received image data.

In some embodiments, the signal processor 130 may receive image data from the image sensor 110 and perform various image processing operations on the image data. Thereafter, the signal processor 130 may transmit processed image data to the memory 120. The memory 120 may store the image data received from the signal processor 130.

The image sensor module 100 may output image data through the interface 140. For example, in some example embodiments, the interface 140 may output image data stored in the memory 120 and/or image data processed by the signal processor 130. The image sensor module 100 may also output calculation data, which results from a calculation operation of the memory 120, through the interface 140. For example, the interface 140 may include a mobile industry processor interface (MIPI) based camera serial interface (CSI). The kind of the interface 140 is not limited thereto and may be implemented according to various protocol standards.

The image processing device 200 may include an interface 210 and a processor 220. The image processing device 200 may receive image data and/or calculation data from the image sensor module 100 through the interface 210. For example, the interface 210 may be connected to and/or configured to communicate with the interface 140. Like the interface 140, the interface 210 may include a MIPI but is not limited thereto. The image processing device 200 may store the image data and/or the calculation data in a memory (not shown).

The processor 220 may perform various image processing operations, for example, based on the image data and/or the calculation data received through the interface 210. According to the present example embodiment, as an example of an image processing operation, the processor 220 may perform object detection on at least one object included in an image and/or perform segmentation thereon for object detection. For example, in some example embodiments, the processor 220 may receive pattern density data and optical flow data from the image sensor module 100 together with raw image data and/or pre-processed image data. The processor 220 may detect and/or segment an object included in an image by analyzing the image data using the pattern density data and the optical flow data.

The processor 220 may include and/or be included in various calculation processing devices such as a CPU, a graphics processing unit (GPU), an application processor (AP), a digital signal processor (DSP), a field-programmable gate array (FPGA), a neural network processing unit (NPU), an electronic control unit (ECU), an image signal processor (ISP), and/or the like.

According to the present example embodiment, the image sensor module 100 may increase the calculation speed of an image processing operation by performing a calculation process using the memory 120 to perform the calculation process. For example, since the bandwidth between the memory bank 122 and the PIM circuit 124 in the memory 120 is usually higher than a bandwidth between the memory 120 and the signal processor 130, when the calculation process is performed using the memory 120, the calculation speed may be increased. When the calculation speed is increased, a neural network calculation having more layers may be performed during the same time as before. Accordingly, the accuracy of the calculation operation of the image sensor module 100 may be increased.

For example, in some example embodiments, the image sensor module 100 provides pattern density data and optical flow data, which are generated using the memory 120, to the image processing device 200; and the image processing device 200 performs object detection based on the pattern density data and the optical flow data received together with image data. Accordingly, the calculation speed of the object detection operation of the image processing system 10 may be increased.

In the embodiment of FIG. 1, the processing elements PEs may include various numbers and arrangements of the processing elements. For example, each processing element may be arranged in correspondence to one bank or at least two banks.

Figure 2:
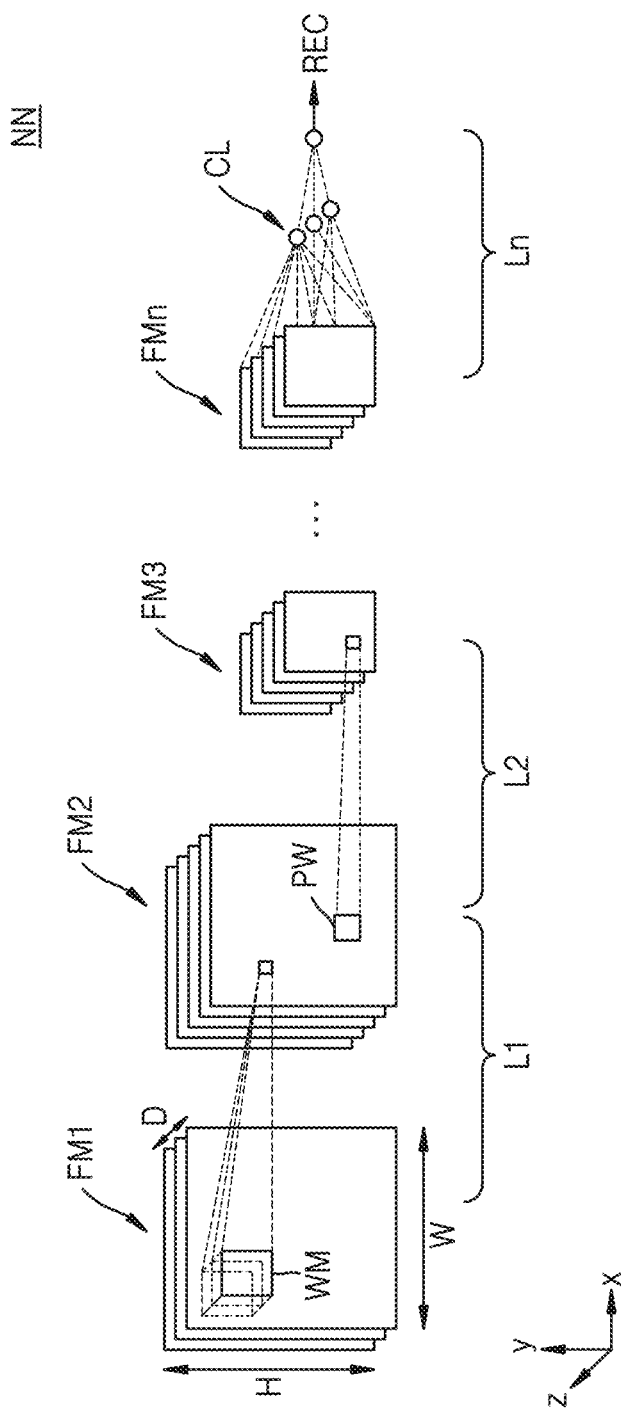
FIG. 2 illustrates an example of a neural network structure according to some example embodiments.

Although it is illustrated in FIG. 1 that the memory bank 122 is separated from the PIM circuit 124 for ease of understanding and illustration, the memory bank 122 and the PIM circuit 124 may at least partially be merged with each other. An example of this will be described in detail with reference to FIG. 11. FIG. 2 illustrates an example of a neural network structure. The PIM circuit 124 in FIG. 1 may be applied to the implementation of at least part of the structure of a neural network NN of FIG. 2.

Referring to FIG. 2, the neural network NN may include a plurality of layers, for example, first through n-th layers L1 through Ln. The neural network NN with such multilayer architecture may be referred to as a deep neural network (DNN) and/or a deep learning architecture. Each of the first through n-th layers L1 through Ln may include a linear layer and/or non-linear layer. In some example embodiments, at least one linear layer may be combined with at least one non-linear layer, thereby forming a single layer. For example, the linear layers may include a convolution layer and a fully-connected layer, and the non-linear layers may include a pooling layer and an activation layer.

For example, the first layer L1 may correspond to a convolution layer, the second layer L2 may correspond to a pooling layer, and the n-th layer Ln may correspond to a fully-connected layer as an output layer. The neural network NN may further include an activation layer and/or may further include other layers performing other kinds of calculations.

Each of the first through n-th layers L1 through Ln may receive, as an input feature map, an image frame, and/or a feature map generated in a previous layer and may generate an output feature map and/or a recognition signal REC by performing a calculation on the input feature map. At this time, the feature map refers to data, which represents various features of input data. For example, first through n-th feature maps FM1, FM2, FM3, and FMn may have a two-dimensional and/or a three-dimensional matrix (e.g., a tensor) form, which includes a plurality of feature values. The first through n-th feature maps FM1 through FMn may have a width W (e.g., a column), a height H (e.g., a row), and a depth D, which may respectively correspond to the x-axis, the y-axis, and the z-axis in a coordinate system. At this time, for example, the depth D may be referred to as the number of channels.

The first layer L1 may generate the second feature map FM2 by performing a convolution on the first feature map FM1 and a weight map WM. The weight map WM may have a two-dimensional and/or three-dimensional matrix form including a plurality of weights. The weight map WM may be referred to as filter and/or a kernel. The weight map WM may filter the first feature map FM1. The depth (e.g., the number of channels) of the weight map WM may be same as the depth (e.g., the number of channels) of the first feature map FM1. A convolution may be performed on the same channels in both the weight map WM and the first feature map FM1. The weight map WM may be shifted on the first feature map FM1 by traversing the first feature map FM1 using a sliding window. During a shift, each weight included in the weight map WM may be multiplied by and/or added to all feature values in an area where the weight map WM overlaps the first feature map FM1. One channel of the second feature map FM2 may be generated by performing a convolution on the first feature map FM1 and the weight map WM. Although only one weight map WM is shown in FIG. 2, a plurality of weight maps WM may be convolved with the first feature map FM1 so that a plurality of channels of the second feature map FM2 may be generated. For example, the number of channels of the second feature map FM2 may correspond to the number of weight maps.

The second layer L2 may generate the third feature map FM3 by changing a spatial size of the second feature map FM2 through pooling. The pooling may be referred to as sampling and/or downsampling. A two-dimensional pooling window PW may be shifted on the second feature map FM2 by a unit of the size of the pooling window PW, and a maximum value among feature values (or an average of the feature values) in an area, in which the pooling window PW overlaps the second feature map FM2, may be selected. As such, the third feature map FM3 may be generated by changing the spatial size of the second feature map FM2. The number of channels of the third feature map FM3 may be the same as the number of channels of the second feature map FM2.

The n-th layer Ln may combine features of the n-th feature map FMn and categorize a class CL of the input data.

The n-th layer Ln may also generate the recognition signal REC corresponding to the class CL. The structure of the neural network NN is not limited to the example described above. Some of the first through n-th layers L1 through Ln may be omitted from the neural network NN, or an additional layer may be added to the neural network NN.

According to some example embodiments, the processing elements PEs of the PIM circuit 124 in FIG. 1 may constitute and/or correspond to at least one of the convolution layer, the fully-connected layer, the pooling layer, and the activation layer of the neural network NN. For example, some of the processing elements PEs of the PIM circuit 124 may be configured to perform a convolution calculation on image data read from the banks Bank1 through BankN, and some of the processing elements PEs of the PIM circuit 124 may be configured to perform a pooling calculation on a convolution result.

According to some example embodiments, the processing elements PEs of the PIM circuit 124 may be embodied as a neural network model, which is trained to perform a pattern density detection operation and/or an optical flow detection operation.

Figure 3:
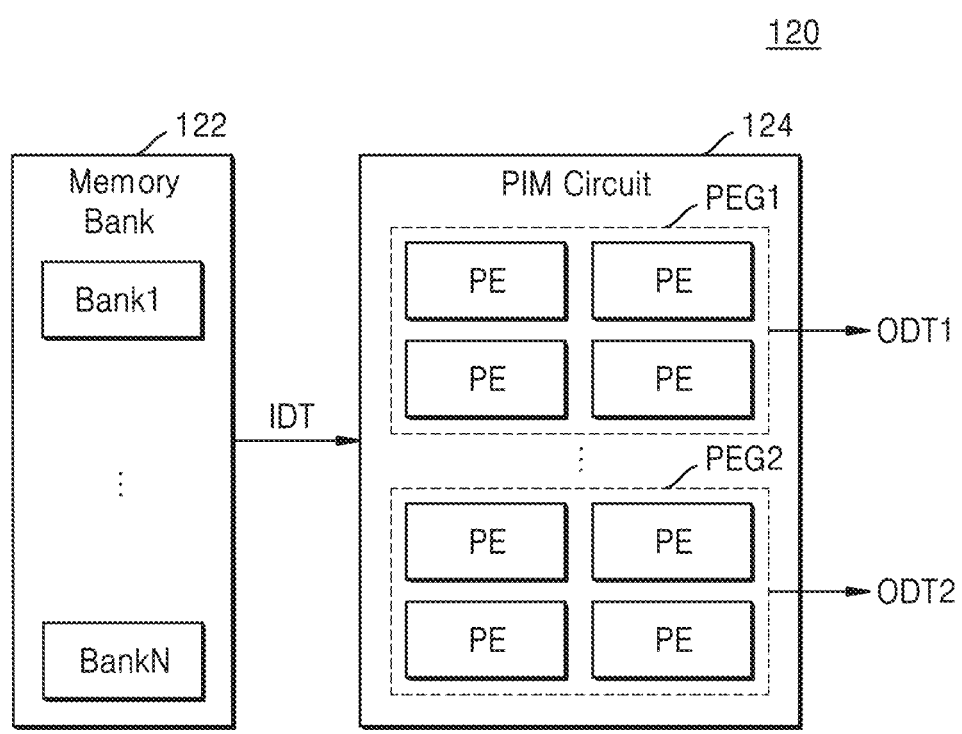
FIG. 3 is a block diagram illustrating the configuration of a memory, according to some example embodiments.

FIG. 3 is a block diagram illustrating the configuration of a memory, according to some example embodiments. In some example embodiments, the memory 120 of FIG. 3 may correspond to the memory 120 in FIG. 1.

Referring to FIG. 3, the memory bank 122 may transmit image data IDT to the PIM circuit 124. In some example embodiments, the memory bank 122 may receive image data IDT (e.g., from the image sensor 110 in FIG. 1), divide the image data IDT (e.g., into a certain size), and store the image data IDT (e.g., in at least one of the banks Bank1 to BankN). The memory bank 122 may read the image data IDT from at least one of the banks Bank1 through BankN and transmit the image data IDT to the PIM circuit 124.

In the some example embodiments, the PIM circuit 124 may include a first processing element group PEG1 performing a first calculation operation and a second processing element group PEG2 performing a second calculation operation. Each of the first processing element group PEG1 and the second processing element group PEG2 may include at least one processing element PE. In some example embodiments, the first calculation operation and the second calculation operation may correspond to image processing operations on the image data IDT.

The first processing element group PEG1 may generate first calculation data ODT1 by performing the first calculation operation based on the image data IDT. The second processing element group PEG2 may generate second calculation data ODT2 by performing the second calculation operation based on the image data IDT. In some example embodiment, each of the first processing element group PEG1 and the second processing element group PEG2 may be embodied as a neural network module performing the first and/or second calculation operations. In some example embodiments, the first calculation data ODT1 and the second calculation data ODT2 may be stored in the memory bank 122 and/or an external device (e.g., the image processing device 200 in FIG. 1) of the memory 120.

According to some example embodiments, the first processing element group PEG1 may be embodied as a neural network module, which is trained to perform an optical flow detection operation as the first calculation operation. The first processing element group PEG1 may generate optical flow data as the first calculation data ODT1 by performing an optical flow detection operation on the image data IDT.

In some embodiments, the optical flow detection operation needs a plurality of frames of the image data IDT. Accordingly, the image sensor 100 in FIG. 1 may store a plurality of frames of the image data IDT, which are generated at different time points, in the memory bank 122; and the first processing element group PEG1 may receive the frames of the image data IDT from the memory bank 122 and perform a flow detection operation.

The second processing element group PEG2 may be embodied as a neural network module, which is trained to perform a pattern density detection operation as the second calculation operation. The second processing element group PEG2 may generate pattern density data as the second calculation data ODT2 by performing a pattern density detection operation on the image data IDT.

Although it is illustrated in FIG. 3 that the memory bank 122 is separated from the PIM circuit 124 for easy understanding, the memory bank 122 and the PIM circuit 124 may at least partially be merged with each other. An example of this will be described in detail with reference to FIG. 11.

FIG. 4A is a block diagram for describing operations of an image sensor module and an image processing device, according to some example embodiments. The image sensor module 100 and the image processing device 200 in FIG. 4A may respectively correspond to the image sensor module 100 and the image processing device 200 in FIG. 1.

Referring to FIG. 4A, the image sensor module 100 may include an optical flow module 125, which corresponds to a neural network model trained to perform an optical flow detection operation, and a pattern density module 126, which corresponds to a neural network model trained to perform a pattern density detection operation. The optical flow module 125 may correspond to the first processing element group PEG1 in FIG. 3, and the pattern density module 126 may correspond to the second processing element group PEG2 in FIG. 3.

The optical flow module 125 may receive the image data IDT from the memory bank 122 and generate optical flow data OF by performing an optical flow detection operation on the image data IDT. The pattern density module 126 may receive the image data IDT from the memory bank 122 and generate pattern density data PD by performing a pattern density detection operation on the image data IDT. The image sensor module 100 may transmit the image data IDT, the optical flow data OF, and the pattern density data PD to the image processing device 200.

Referring to FIG. 4A, the processor 220 of the image processing device 200 may include a depth information module 222 generating depth information and an object detection module 224 performing object detection. As a non-limiting example, the depth information module 222 and the object detection module 224 may be embodied as neural network models.

The depth information module 222 may generate depth information DI regarding the image data IDT based on the optical flow data OF and the pattern density data PD, which are received from the image sensor module 100. For example, the depth information DI may include a depth value corresponding to a distance from the image sensor 110 to an object included in the image data IDT. In some example embodiments, the depth information module 222 may generate the depth information DI regarding the image data IDT based on a characteristic by which the farther the object, the higher the pattern density and a characteristic by which the farther the object, the less the position change over time. The depth information module 222 may provide the depth information DI to the object detection module 224.

The object detection module 224 may receive the image data IDT and the optical flow data OF from the image sensor module 100 and the depth information DI from the depth information module 222. The object detection module 224 may perform object detection on the image data IDT, e.g., based on the optical flow data OF and the depth information DI. The object detection module 224 may generate object information OI (which may include various kinds of information about an object detected in the image data IDT) as an object detection result. For example, the object information OI may include three-dimensional (3D) information (which may include a 3D bounding box surrounding an object), the shape of the object, a distance to the object, and/or the position of the object; and/or two-dimensional (2D) information including, e.g., an edge of the object. A method, performed by the object detection module 224, of generating the object information OI will be described in detail with reference to FIGS. 7 through 10 below.

Although it is described that the object detection module 224 performs object detection based on the image data IDT, the optical flow data OF, and the depth information DI in the embodiment of FIG. 4A, other various kinds of information (e.g., the pattern density data PD) may be additionally considered when the object detection is performed.

Although it is illustrated and described that the processor 220 includes both the depth information module 222 and the object detection module 224 in the embodiment of FIG. 4A, embodiments are not limited thereto. For example, the image processing device 200 may include the processor 220 including the depth information module 222 and a separate (e.g., second) processor including the object detection module 224.

Figure 4B:
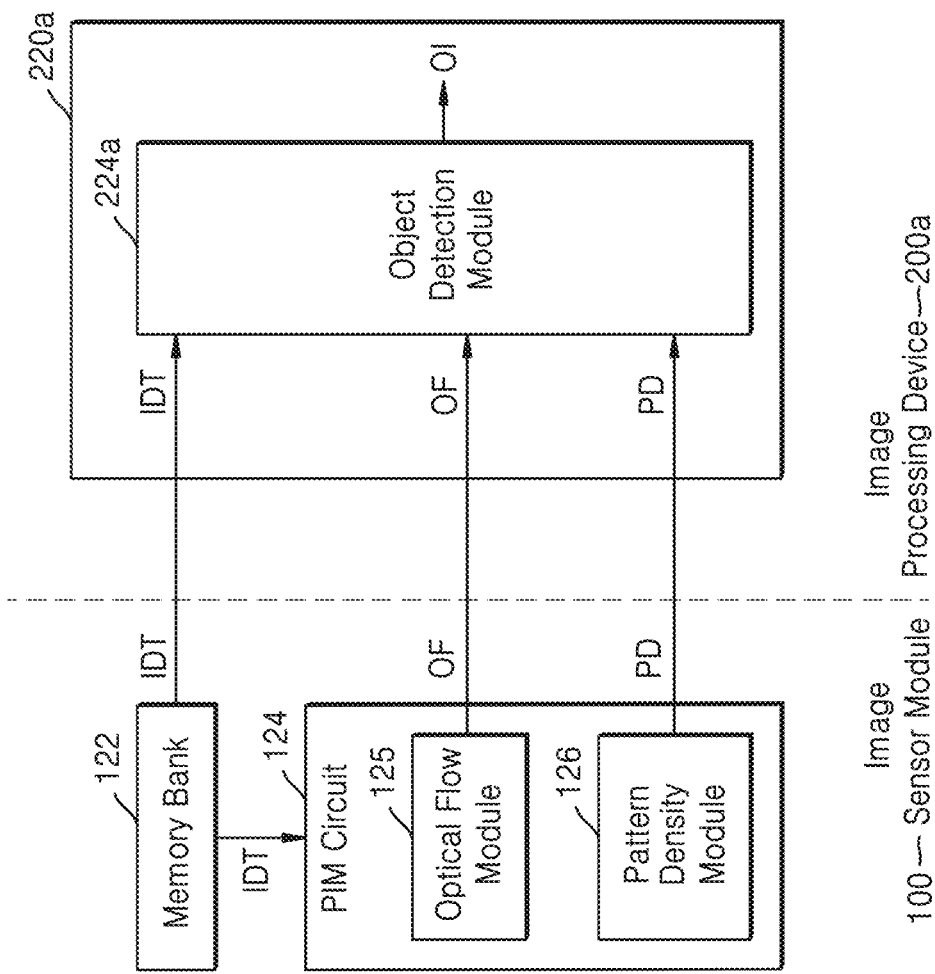

FIG. 4B is a block diagram for describing operations of an image sensor module and an image processing device, according to some example embodiments. FIG. 4B illustrates a modified embodiment of FIG. 4A. Hereinafter, redundant descriptions given above with reference to FIG. 4A are omitted.

Referring to FIG. 4B, a processor 220a of an image processing device 200a may include an object detection module 224a configured to perform an object detection operation. The object detection module 224a may receive the image data IDT, the optical flow data OF, and the pattern density data PD from the image sensor module 100. The object detection module 224a may perform object detection on the image data IDT based on the optical flow data OF and/or the pattern density data PD. The object detection module 224a may generate the object information OI regarding the image data IDT. An example method of generating the object information OI will be described in detail with reference to FIGS. 7 through 10 below.

In FIGS. 4A and 4B, each of the depth information module 222 and the object detection module 224 and/or 224a may be implemented by firmware and/or software and may be loaded to a memory (not shown) of the image processing device 200 and/or 200a and then executed by the processor 220 or 220a. However, embodiments are not limited thereto. Each of the depth information module 222 and the object detection module 224 or 224a may be implemented by hardware or a combination of software and hardware.

As described above, the image sensor module 100 may generate the optical flow data OF and the pattern density data PD with respect to the image data IDT using the memory 120 that performs a calculation process. The image processing device 200 and/or 200a may perform object detection based on the image data IDT, the optical flow data OF, and/or the pattern density data PD, which are received from the image sensor module 100.

Figure 5:
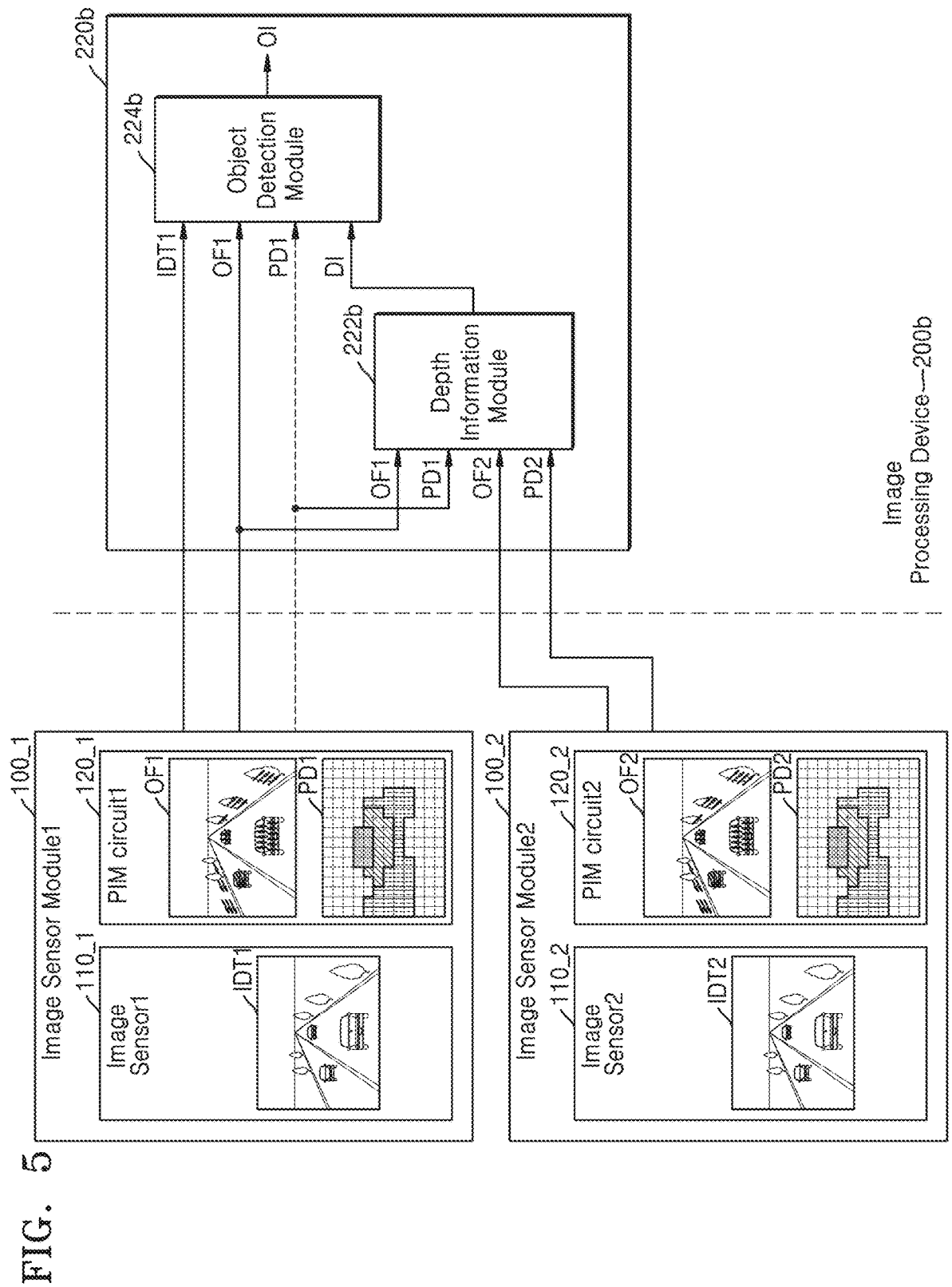
FIG. 5 is a block diagram for describing operations of a plurality of image sensor modules and an image processing device, according to some example embodiments.

FIG. 5 is a block diagram for describing operations of a plurality of image sensor modules and an image processing device, according to some example embodiments. The example embodiments illustrated in FIG. 5 are based on a modified embodiment of FIG. 4A. Hereinafter, redundant descriptions given above with reference to FIG. 4A are omitted.

According to some example embodiments, there may be a plurality of image sensor modules. For example, referring to FIG. 5, there may be a first image sensor module 100_1 and a second image sensor module 100_2. In the example embodiments, the first and second image sensor modules 100_1 and 100_2 may be adjacent to each other and capture images in similar directions to each other and may be referred to as a stereo camera. For example, the first image sensor module 100_1 may capture a left-eye image and the second image sensor module 100_2 may capture a right-eye image.

Each of the first and second image sensor modules 100_1 and 100_2 may be the same as and/or similar to the image sensor module 100 in FIG. 4A. In some example embodiments, the first image sensor module 100_1 may include a first image sensor 110_1 and a first PIM circuit 120_1. The first image sensor 110_1 may generate first image data IDT1, and the first PIM circuit 120_1 may generate first optical flow data OF1 and first pattern density data PD1 based on the first image data IDT1.

The second image sensor module 100_2 may include a second image sensor 110_2 and a second PIM circuit 120_2. The second image sensor 110_2 may generate second image data IDT2, and the second PIM circuit 120_2 may generate second optical flow data OF2 and second pattern density data PD2 based on the second image data IDT2.

Referring to FIG. 5, a processor 220b of an image processing device 200b may include a depth information module 222b and an object detection module 224b. The depth information module 222b may receive the first and second optical flow data OF1 and OF2 and the first and second pattern density data PD1 and PD2 from the first and second image sensor modules 100_1 and 100_2 and generate the depth information DI based on the received data. For example, the first optical flow data OF1 and the first pattern density data PD1 may correspond with a left-eye image (e.g., the first image data IDT1), and the second optical flow data OF2 and the second pattern density data PD2 correspond with a right-eye image (e.g., the second image data IDT2). The depth information module 222b may generate the depth information DI. For example, the depth information module 222b may determine a difference between the left eye-image and the right-eye image, wherein the difference decreases the farther the object is from the first and second image sensor modules 100_1 and 100_2. The depth information module 222b may provide the depth information DI to the object detection module 224b.

The object detection module 224b may receive image data (e.g., the first image data IDT1) and/or optical flow data (e.g., the first optical flow data OF1) from at least one of the first image sensor module 100_1 and/or the second image sensor module 100_2; and the depth information DI from the depth information module 222b. The object detection module 224b may generate the object information OI by performing object detection on the first image data IDT1 based on the first optical flow data OF1 and the depth information DI.

However, the example embodiments are not limited thereto. For example, the object detection module 224b may receive the second image data IDT2 and the second optical flow data OF2 from the second image sensor module 100_2 and the depth information DI from the depth information module 222b and perform object detection.

FIGS. 6A and 6B are diagrams for describing a method of generating optical flow data according to a shooting mode of an image sensor module, according to some example embodiments. With reference to FIGS. 6A and 6B, the following description includes the PIM circuit 124 of the memory 120 in FIG. 1 with the optical flow module 125 in FIG. 4A.

In some example embodiment, the image sensor module 100 may provide the functions of a normal shooting mode and/or a burst shooting mode. In the normal shooting mode, an object is shot in a reference time unit and image data is generated. In the burst shooting mode, an object may be shot multiple times in succession in the reference time unit and a plurality of pieces of image data are generated.

Referring to FIG. 6A, when the image sensor module 100 operates in the normal shooting mode, a single frame of image data may be generated in the reference time unit (e.g., every 1/60 second). For example, an image sensor (e.g., the image sensor 110 of FIG. 1 and/or first and second image sensors 110_1 and 110_2 of FIG. 5) may capture a plurality of frames (e.g., at least the first through fourth frames Frame1 through Frame4), and, the PIM circuit 124 may generate the first optical flow data OF1 and the second optical flow data OF2 using, e.g., the first through fourth frames Frame1 through Frame4.

For example, when the PIM circuit 124 performs an optical flow detection operation using three frames, the PIM circuit 124 may generate the first optical flow data OF1 using the first through third frames Frame1 through Frame3 and generate the second optical flow data OF2 using the second through fourth frames Frame2 through Frame4. For example, in some example embodiments, it may take three-sixtieths (3/60) of a second (e.g., 1/20 of a second) for the PIM circuit 124 to generate a piece of optical flow data.

Referring to FIG. 6B, when the image sensor module 100 operates in the burst shooting mode, a plurality of (e.g., three) frames of image data may be generated in the reference time unit (e.g., every 1/60 second). The PIM circuit 124 may generate first through fourth optical flow data OF1 through OF4 using the plurality of frames (e.g., first through twelfth frames Frame1 through Frame12). For example, the PIM circuit 124 may perform an optical flow detection operation using three frames. For example, it may take 1/60 of a second for the PIM circuit 124 to generate a piece of optical flow data.

As described above, when the image sensor module 100 supports the function of the burst shooting mode, the calculation speed of the optical flow detection operation may be increased. In addition, a neural network model (e.g., the optical flow module 125 in FIG. 4A) trained to perform an optical flow detection operation may be embodied in a simpler structure as the difference between pieces of image data input to the neural network model decreases. Accordingly, when optical flow detection is performed using a plurality of frames shot in the burst shooting mode, the optical flow module 125 in FIG. 4A, including a simpler structure, may be included in the PIM circuit 124.

Although it has been illustrated and described that the PIM circuit 124 performs an optical flow detection operation using three frames in the embodiments of FIGS. 6A and 6B, embodiments are not limited thereto. For example, the PIM circuit 124 may perform an optical flow detection operation using fewer or more than three frames.

Figure 7:
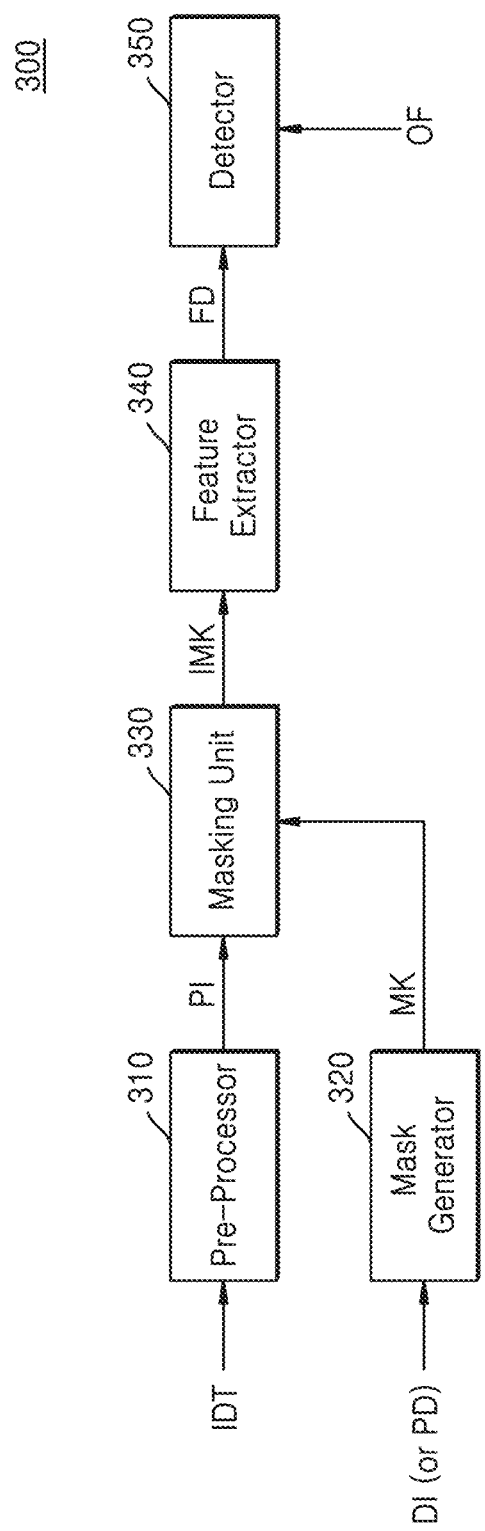
FIG. 7 is a block diagram illustrating the configuration of an object detection module, according to some example embodiments.

FIG. 7 is a block diagram illustrating the configuration of an object detection module, according to some example embodiments. For example, an object detection module 300 of FIG. 7 may be the same as or similar to the object detection module 224, 224a, and/or 224b in FIGS. 4A, 4B, and/or 5.

Referring to FIG. 7, the object detection module 300 may include a pre-processor 310, a mask generator 320, a masking unit 330, a feature extractor 340, and a detector 350.

The pre-processor 310 may receive and down sample the image data IDT and generate and output a plurality of pyramid images PI. The pre-processor 310 may generate a first pyramid image by down sampling the width and length of the image data IDT by a certain (and/or otherwise determined) factor, and a second pyramid image may be generated by down sampling the first pyramid image by the certain factor. For example, the pre-processor 310 may generate the pyramid images PI, which are derived from the image data IDT and have sizes gradually reduced from the size of the image data IDT.

The mask generator 320 may receive the depth information DI, and generate (and output) a plurality of pieces of mask data MK for the pyramid images PI based on the depth information DI. The mask data MK may be used to mask the remaining region of an image excluding a meaningful region.

In an example embodiment, the meaningful region of each pyramid image PI may be different according to resolution. For example, relatively high resolution is required to detect a distant object, whereas relatively low resolution may be sufficient for detection of a near object. Accordingly, as the number of times of down sampling performed to generate the pyramid images PI decreases (e.g., as the resolution increases) the meaningful region may include an image region corresponding to a distant object. Contrarily, as the number of times of down sampling performed to generate the pyramid images PI increases (e.g., as resolution decreases) the meaningful region may include an image region corresponding to a near object.

In an example embodiment, the mask generator 320 may identify depth values corresponding to the resolution of each pyramid image PI based on the depth information DI and generate the mask data MK including the depth values. For example, the mask generator 320 may identify high depth values when the resolution of the pyramid image PI is high and may identify low depth values when the resolution of the pyramid image PI is low. Accordingly, a region including the depth values may correspond to the meaningful region of the pyramid image PI.

Alternatively, the mask generator 320 may be configured to receive the pattern density data PD instead of the depth information DI and generate and output the mask data MK for the pyramid images PI based on the pattern density data PD. A pattern density has a characteristic of being higher when an object is near than when the object is far away. Accordingly, a high pattern density may correspond to a high depth value, and a low pattern density may correspond to a low depth value.

The masking unit 330 may receive the pyramid images PI and the pieces of the mask data MK and generate and output a plurality of masked images IMK by applying the pieces of the mask data MK to the pyramid images PI.

In some example embodiments, the masking unit 330 may identify the remaining region excluding the meaningful region of each pyramid image PI based on a piece of the mask data MK corresponding to the pyramid image PI, and generate a masked image IMK by masking the remaining region.

The feature extractor 340 may receive the masked images IMK and output a plurality of pieces of feature data FD for the masked images IMK. For example, the feature data FD may include the feature map, the class CL, and/or the recognition signal REC described above with reference to FIG. 2. In some embodiments, the feature data FD may be constituted of various types of data including a feature of an unmasked region of each pyramid image PIM and/or the image data IDT.

The detector 350 may receive the pieces of the feature data FD, identify, and/or detect at least one object included in the image data IDT based on the pieces of the feature data FD, and generate the object information OI including various kinds of information about the object.

In some example embodiments, the detector 350 may additionally receive the optical flow data OF and may detect an object based on the optical flow data OF and the pieces of the feature data FD. Because the optical flow data OF includes information about a time-sequential motion of an object, the detector 350 may increase the accuracy of object detection by using the optical flow data OF.

Figure 8A:
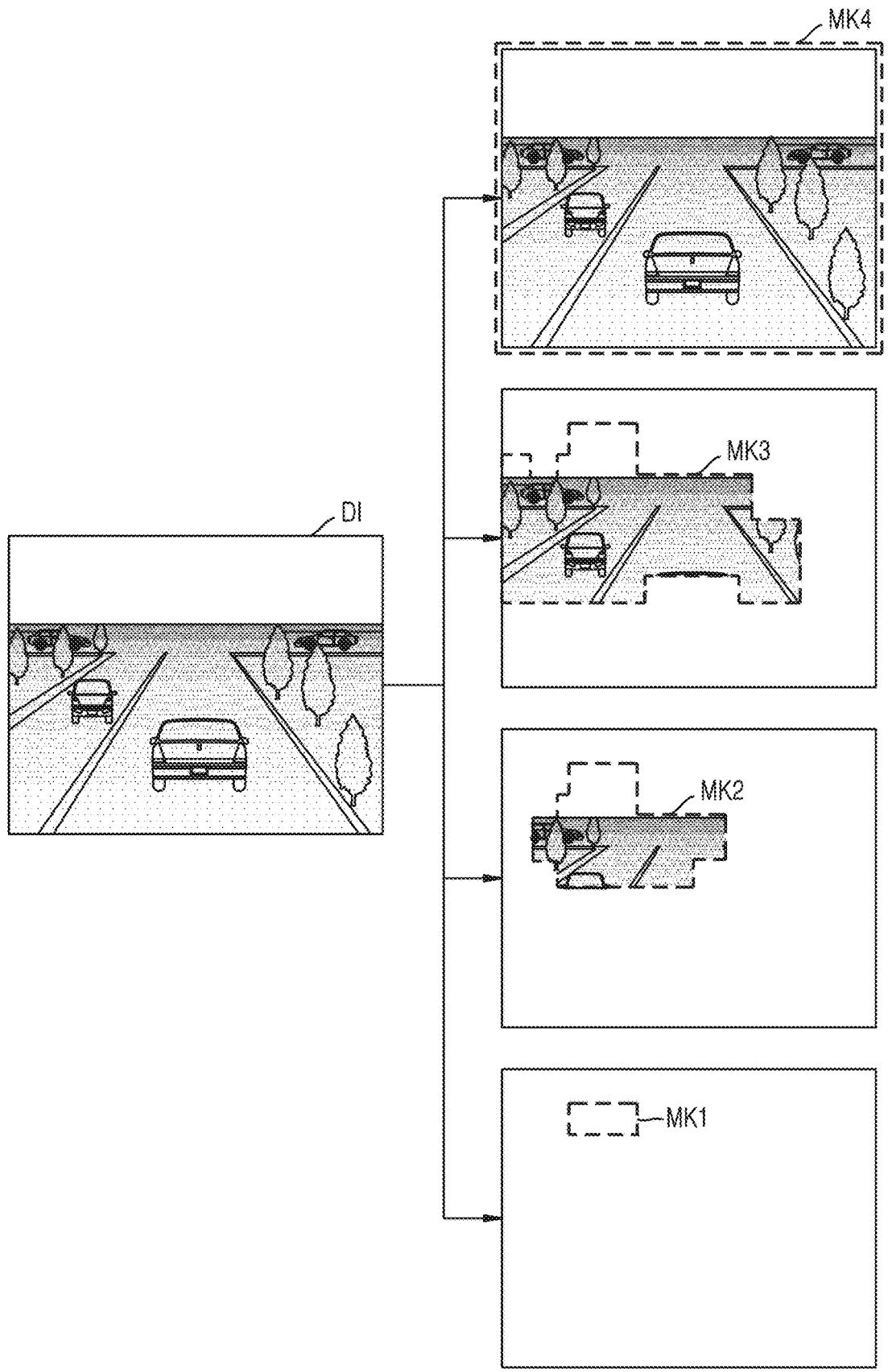
FIGS. 8A and 8B are diagrams illustrating mask data according to some example embodiments.
Figure 8B:
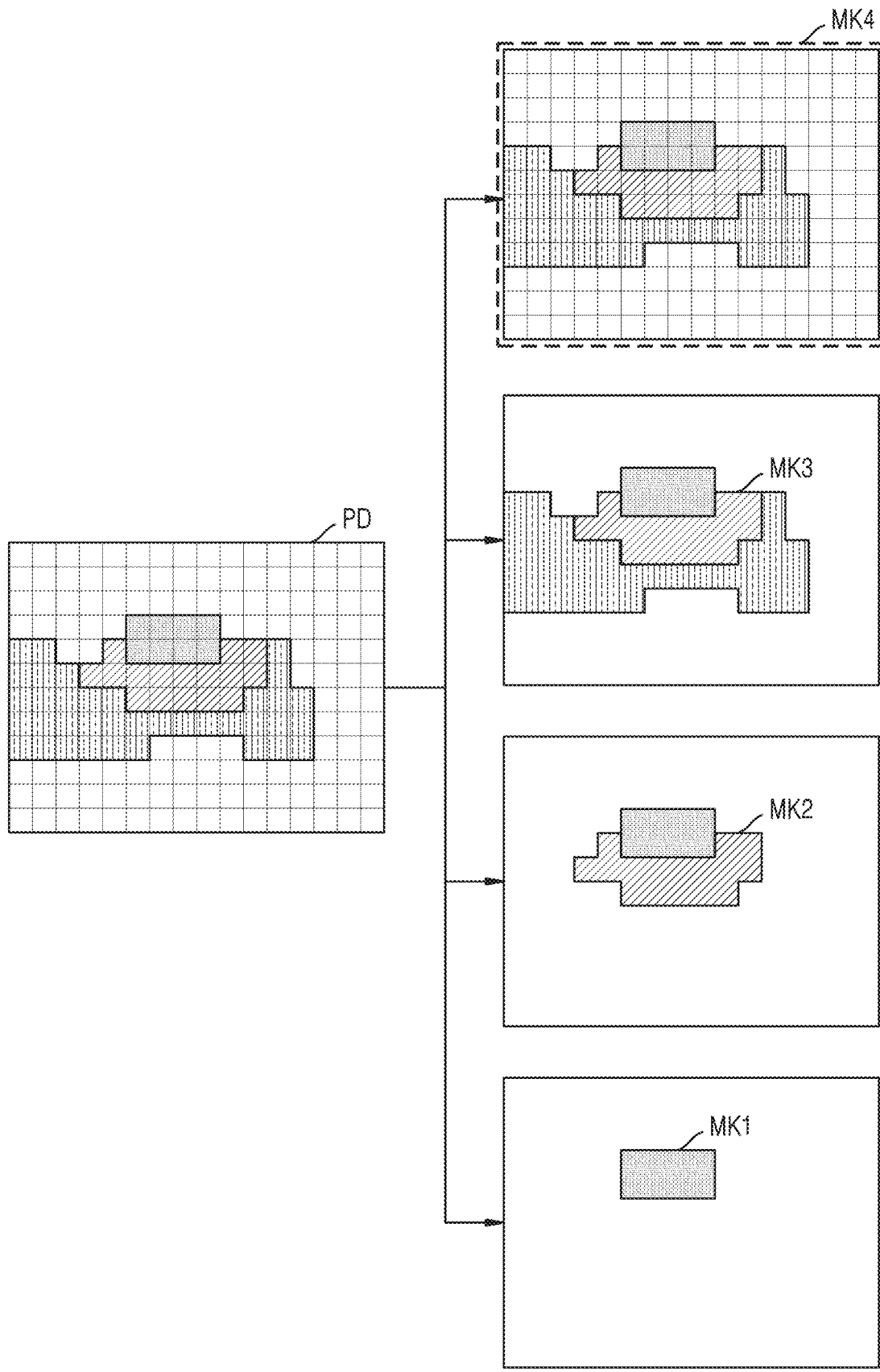

FIGS. 8A and 8B are diagrams illustrating mask data according to some example embodiments. FIG. 8A is an example diagram illustrating the mask data MK generated based on the depth information DI, and FIG. 8B is an example diagram illustrating the mask data MK generated based on the pattern density data PD.

Referring to FIG. 8A, the mask generator 320 may identify depth values, which respectively belong to certain depth ranges, based on the depth information DI and generate one of a plurality of mask data (e.g., first through fourth mask data MK1 through MK4) based on the depth values in each depth range.

For example, in some example embodiments, the mask generator 320 may identify first depth values in a first depth range, which has a relatively high average value, from the depth information DI and generate the first mask data MK1 including the first depth values. The mask generator 320 may identify second depth values in a second depth range, which has a lower average value than the first depth range, from the depth information DI and generate the second mask data MK2 including the second depth values. The mask generator 320 may identify third depth values in a third depth range, which has a lower average value than the second depth range, from the depth information DI and generate the third mask data MK3 including the third depth values. The mask generator 320 may identify fourth depth values in a fourth depth range, which has a lower average value than the third depth range, from the depth information DI and generate the fourth mask data MK4 including the fourth depth values.

Referring to FIG. 8B, the mask generator 320 may identify density values, which respectively belong to certain density ranges, based on the pattern density data PD and generate one of the first through fourth mask data MK1 through MK4 based on the density values in each density range.

For example, in some example embodiments, the mask generator 320 may identify first density values in a first density range, which has a relatively high average value, from the pattern density data PD and generate the first mask data MK1 including the first density values. The mask generator 320 may identify second density values in a second density range, which has a lower average value than the first density range, from the pattern density data PD and generate the second mask data MK2 including the second density values. The mask generator 320 may identify third density values in a third density range, which has a lower average value than the second density range, from the pattern density data PD and generate the third mask data MK3 including the third density values. The mask generator 320 may identify fourth density values in a fourth density range, which has a lower average value than the third density range, from the pattern density data PD and generate the fourth mask data MK4 including the fourth density values.

Figure 9:
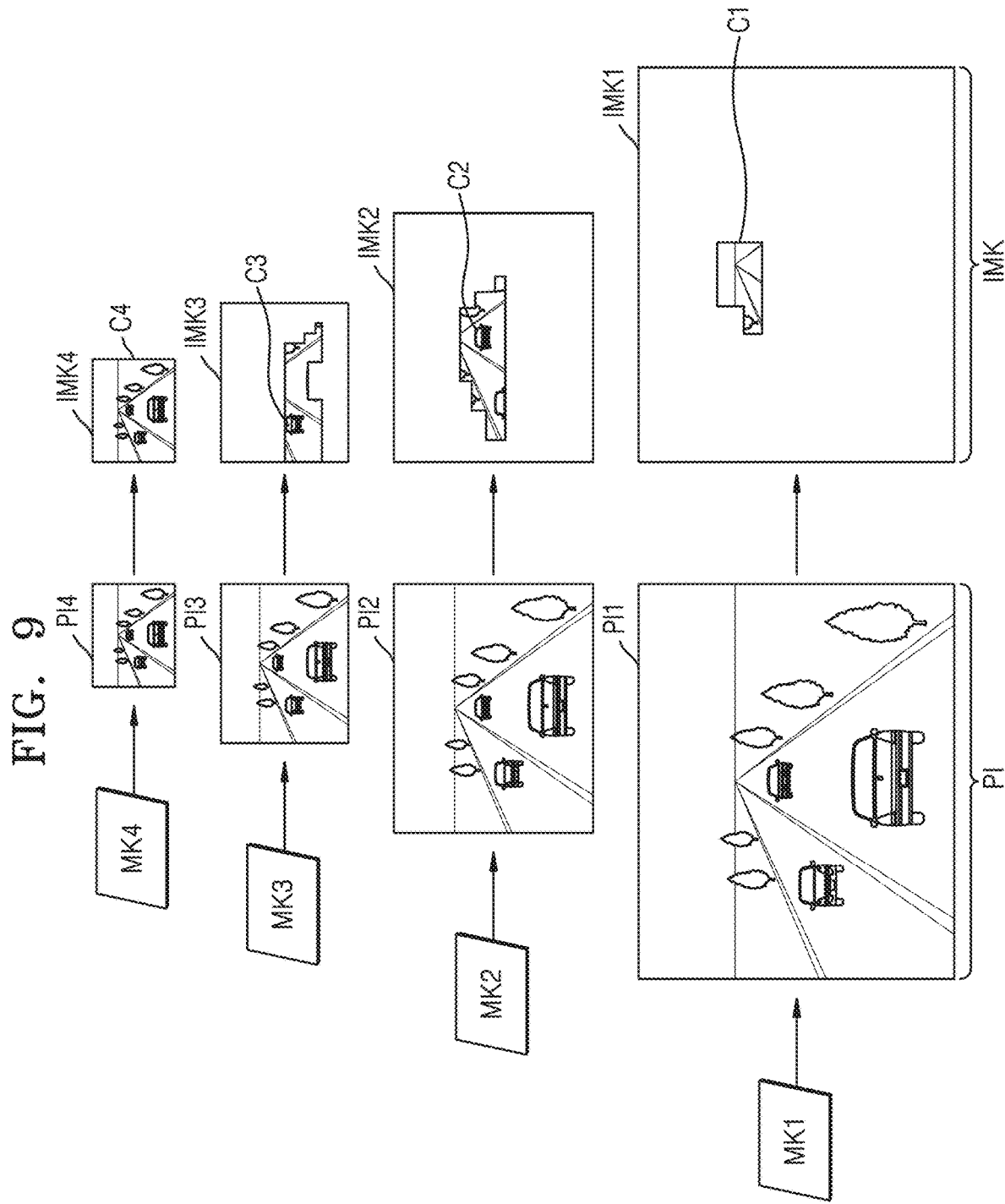
FIG. 9 is a diagram for describing an operation of generating masked images, according to some example embodiments.

FIG. 9 is a diagram for describing an operation of generating masked images, according to some example embodiments.

Referring to FIG. 9, first to fourth masked images IMK1 to IMK4 may be generated by respectively applying the first through fourth mask data MK1 through MK4 to first through fourth pyramid images PI1 through PI4. For example, the masking unit 330 may mask the remaining region of each of the first through fourth pyramid images PI1 through PI4 excluding a meaningful region thereof based on corresponding one of the first through fourth mask data MK1 through MK4.

In some example embodiments, the first through fourth mask data MK1 through MK4 may be applied according to the resolution of each of the first through fourth pyramid images PI1 through PI4. For example, the masking unit 330 may apply the first mask data MK1, which is constituted of depth values (and/or density values) of which the average is high, to the first pyramid image PI1 having a high resolution. The masking unit 330 may apply the fourth mask data MK4, which is constituted of depth values (and/or density values) of which the average is low, to the fourth pyramid image PI4 having a low resolution.

The first masked image IMK1 is constituted of a first region C1 corresponding to a portion of the first pyramid image PI1, the second masked image IMK2 is constituted of a second region C2 corresponding to a portion of the second pyramid image PI2, the third masked image IMK3 is constituted of a second region C3 corresponding to a portion of the third pyramid image PI3, and the fourth masked image IMK4 is constituted of a fourth region C4 corresponding to a portion of the fourth pyramid image PI4. Each of the first through fourth regions C1 through C4 may correspond to a portion of a corresponding one of the first through fourth pyramid images PI1 through PI4, which is not masked by a corresponding one of the first through fourth mask data MK1 through MK4.

Figure 10:
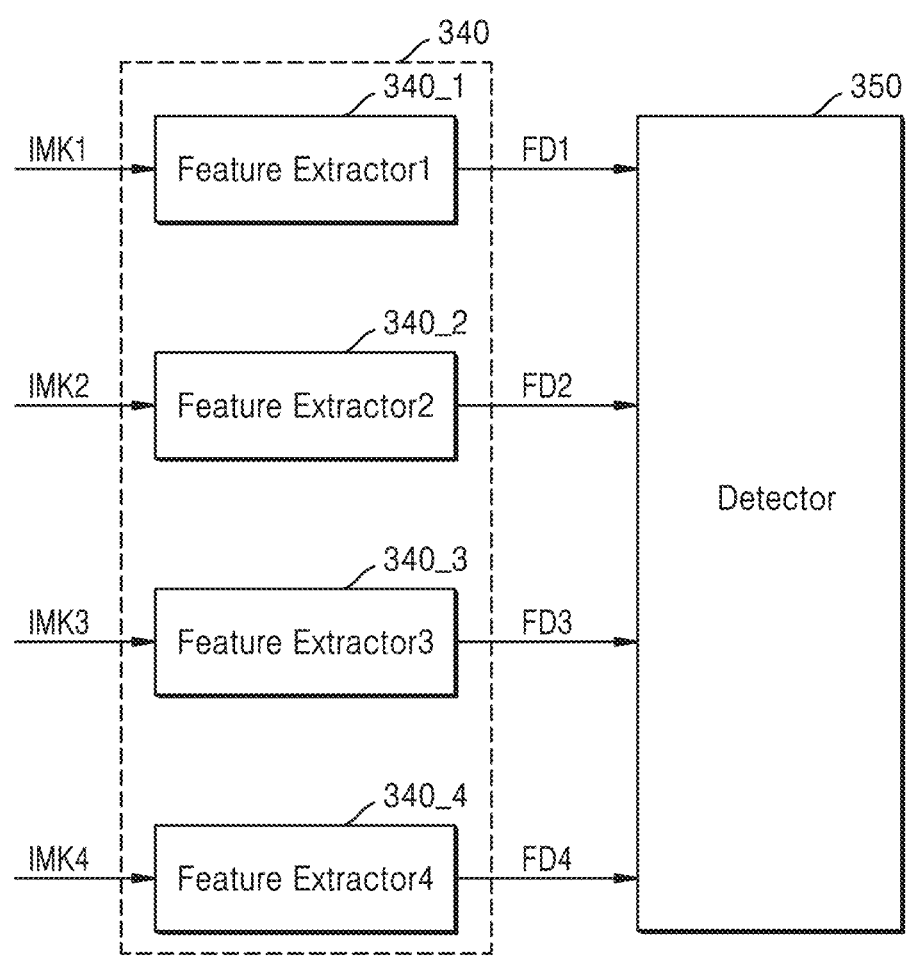
FIG. 10 is a diagram for describing operations of a feature extractor and a detector, according to some example embodiments.

FIG. 10 is a diagram for describing operations of the feature extractor 340 and the detector 350, according to some example embodiments.

Referring to FIG. 10, the feature extractor 340 may include first through fourth feature extractors 340_1 through 340_4. The first through fourth feature extractors 340_1 through 340_4 may respectively receive the first to fourth masked images IMK1 to IMK4, and generate (and output) first through fourth feature data FD1 through FD4 with respect to the first to fourth masked images IMK1 to IMK4.

For example, the first feature extractor 340_1 may generate the first feature data FD1 based on the first masked image IMK1, the second feature extractor 340_2 may generate the second feature data FD2 based on the second masked image IMK2, the third feature extractor 340_3 may generate the third feature data FD3 based on the third masked image IMK3, and the fourth feature extractor 340_3 may generate the fourth feature data FD4 based on the fourth masked image IMK4. Although it is illustrated and described that the first through fourth feature extractors 340_1 through 340_4 are separate, embodiments are not limited thereto.

In some example embodiments, the detector 350 may receive the first through fourth feature data FD1 through FD4 respectively from the first through fourth feature extractors 340_1 through 340_4 and perform object detection based on the first through fourth feature data FD1 through FD4.

Figure 11:
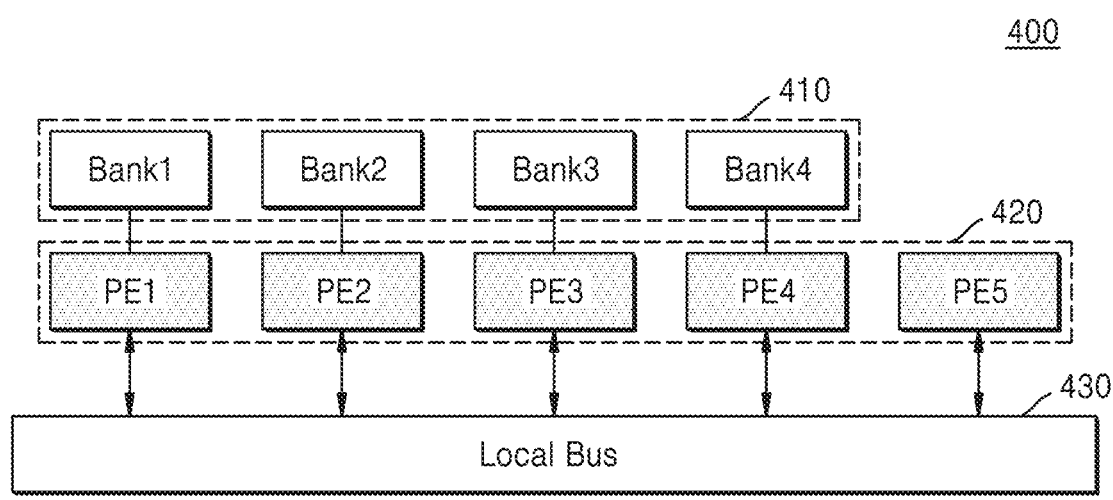
FIG. 11 is a block diagram of a portion of a memory, according to some example embodiments.

FIG. 11 is a block diagram of a portion of a memory, according to some example embodiments. The memory 400 of FIG. 11 may correspond (and/or be included in) to the memory 120 in FIG. 1.

Referring to FIG. 11, the memory 400 may include a bank group 410, a processing element group 420, and a local bus 430. In some example embodiments, the bank group 410 may include a plurality of banks (e.g., first through fourth banks Bank1 through Bank4), and the processing element group 420 may include a plurality of processing elements (e.g., first through fourth processing elements PE1 through PE4) respectively corresponding to the plurality of banks. The processing element group 420 may further include a fifth processing element PE5 independent of the bank group 410.

In some example embodiments, the first through fourth banks Bank1 through Bank4 may be connected to the first through fourth processing elements PE1 through PE4 according to the corresponding relationship therebetween. For example, referring to FIG. 11, the first bank Bank1 may be connected to the first processing element PE1, the second bank Bank2 may be connected to the second processing element PE2, the third bank Bank3 may be connected to the third processing element PE3, the fourth bank Bank4 may be connected to the fourth processing element PE4, etc.

In a storage operation of the memory 400, the bank group 410 may store data transmitted through the local bus 430. In some example embodiments, the memory 400 may receive image data from the image sensor 110 in FIG. 1, and at least one of the first through fourth banks Bank1 through Bank4 may store at least part of the image data. For example, the image data may be divided into a certain size and stored in at least one of the first through fourth banks Bank1 through Bank4.

In a calculation operation of the memory 400, each of some processing elements (e.g., the first through fourth processing elements PE1 through PE4) of the processing element group 420 may perform a calculation operation based on data stored in a bank corresponding thereto in the bank group 410.

For example, referring to FIG. 11, the first processing element PE1 may perform a calculation operation based on data stored in the first bank Bank1, the second processing element PE2 may perform a calculation operation based on data stored in the second bank Bank2, the third processing element PE3 may perform a calculation operation based on data stored in the third bank Bank3, and the fourth processing element PE4 may perform a calculation operation based on data stored in the fourth bank Bank4. At this time, the first through fourth processing elements PE1 through PE4 may perform calculation operations in parallel. For example, in some example embodiments, each of the first through fourth processing elements PE1 through PE4 may perform a convolution calculation in a neural network calculation based on image data stored in a corresponding bank, though the example embodiments are not limited thereto.

In some example embodiments, a processing element (e.g., the fifth processing element PE5) independent of the bank group 410 in the processing element group 420 may perform a calculation operation based on the calculation results of the processing elements described above. For example, the fifth processing element PE5 may perform a pooling calculation in the neural network calculation based on the calculation results of the first through fourth processing elements PE1 through PE4, though the example embodiments are not limited thereto. The fifth processing element PE5 may receive the calculation results of the first through fourth processing elements PE1 through PE4 through the local bus 430 and perform a pooling calculation based on the calculation results.

In some example embodiments, the calculation results of the processing element group 420 may be stored in the bank group 410. For example, the calculation results of the first through fourth processing elements PE1 through PE4 may be respectively stored in the first through fourth banks Bank1 through Bank4. The calculation result of the fifth processing element PE5 may be stored in at least one of the first through fourth banks Bank1 through Bank4.

Locations in which the calculation result of the processing element group 420 is stored, are not limited to those described above and may be set independently of the corresponding relationship between processing elements and banks. For example, the calculation result of the first processing element PE1 may be transmitted to and stored in the second bank Bank2 through the local bus 430.

Although it is illustrated in the embodiment of FIG. 11 that the first through fourth banks Bank1 through Bank4 are respectively connected to the first through fourth processing elements PE1 through PE4, embodiments are not limited thereto. For example, at least one of the first through fourth banks Bank1 through Bank4 may be configured as an independent bank that is not connected to a processing element.

Data stored in the independent bank may also be transmitted to the first through fourth processing elements PE1 through PE4 through the local bus 430. In some example embodiments, the first through fourth processing elements PE1 through PE4 may receive the data from the independent bank through the local bus 430 and immediately perform a calculation process. Alternatively, the data of the independent bank may be stored in the first through fourth banks Bank1 through Bank4 connected to the first through fourth processing elements PE1 through PE4 through the local bus 430, and the first through fourth processing elements PE1 through PE4 may read the data of the independent bank from the first through fourth banks Bank1 through Bank4 and perform a calculation process.

To perform the calculation operation described above, the control logic 126 in FIG. 1 may control the memory bank 122 in FIG. 1 and the PIM circuit 124 in FIG. 1 based on address information and calculation order information. For example, the control logic 126 may read data from an independent bank based on address information regarding the independent bank and transmit the data to the first processing element PE1. The first processing element PE1 may also be set to perform a calculation process on first image data read from the first bank Bank1. Accordingly, the control logic 126 may control the first processing element PE1 (e.g., to perform a calculation process on the data of the independent bank) before or after a calculation operation is performed on the first image data read from the first bank Bank1, based on the calculation order information.

In the embodiment of FIG. 11, the number of banks included in the bank group 410 and the number of processing elements included in the processing element group 420 are just examples, and embodiments are not limited thereto. Fewer or more banks and/or processing elements may be included.

Although it is illustrated and described in the embodiment of FIG. 11 that the memory 400 includes a processing element, e.g., the fifth processing element PE5 in FIG. 11, performing a pooling calculation, embodiments are not limited thereto. For example, the memory 400 may not include a processing element that performs (and/or that is dedicating to performing) a pooling calculation.

Figure 12:
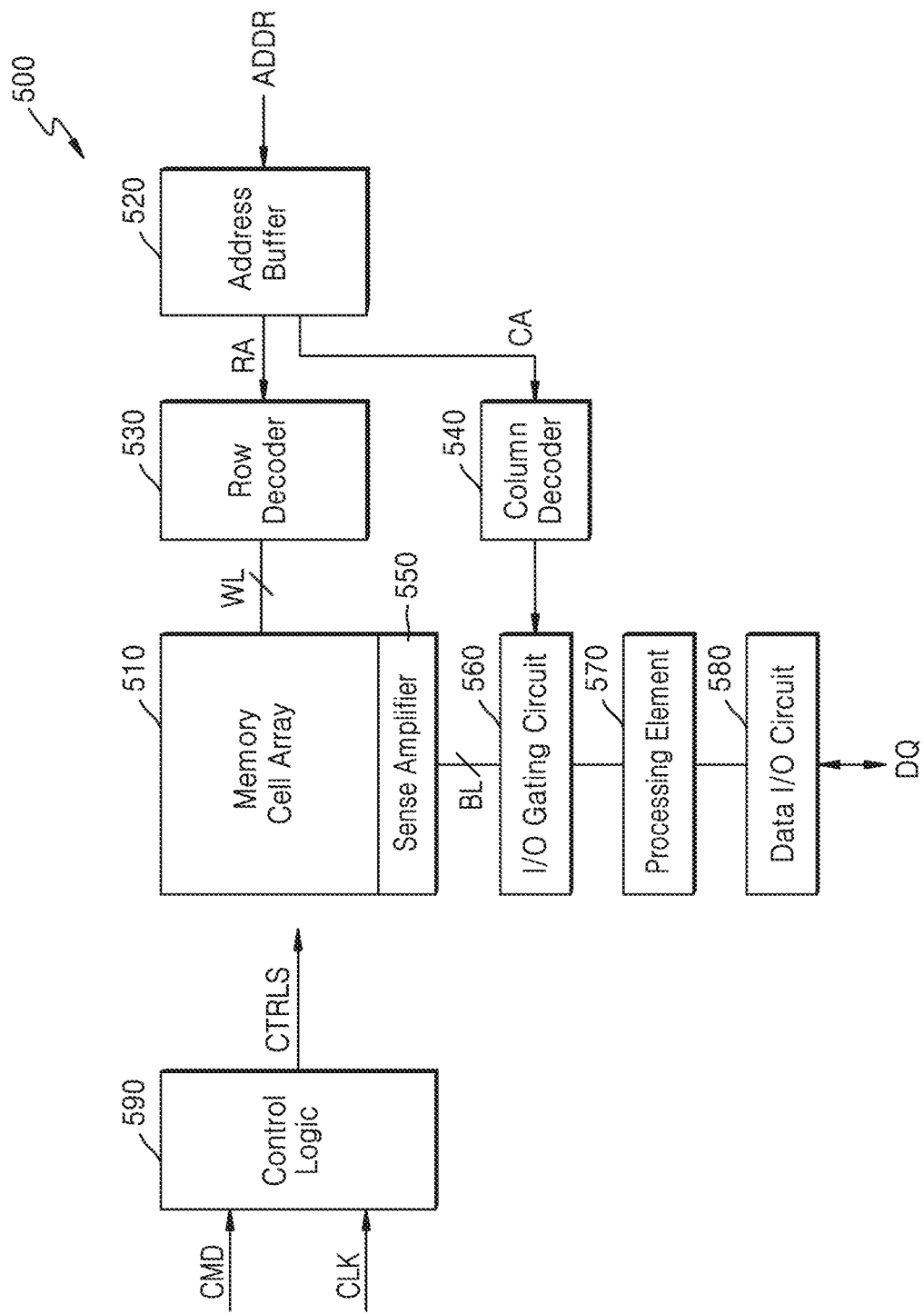
FIG. 12 is a block diagram illustrating the structure of a memory, according to some example embodiments.

FIG. 12 is a block diagram illustrating the structure of a memory, according to some example embodiments. The memory 500 of FIG. 12 may correspond to the memory 120 in FIG. 1 and/or the memory 400 of FIG. 11. FIG. 12 illustrates the structure of a bank and a processing element, which are connected to each other in the memory 500, and may be applied to, for example, the structure of the first bank Bank1 and the first processing element PE1 in FIG. 11.

Referring to FIG. 12, the memory 500 may include a memory cell array 510, an address buffer 520, a row decoder 530, a column decoder 540, a sense amplifier 550, an input/output (I/O) gating circuit 560, a processing element 570, a data I/O circuit 580, and a control logic 590.

The memory cell array 510 may include a plurality of memory cells arranged in a matrix of rows and columns. The memory cell array 510 may include a plurality of word lines WL and a plurality of bit lines BL, wherein the word lines WL and the bit lines BL are connected to the memory cells. For example, each of the word lines WL may be connected to a row of memory cells, and each of the bit lines BL may be connected to a column of memory cells.

The address buffer 520 receives an address ADDR. The address ADDR includes a row address RA, which addresses a row of the memory cell array 510, and a column address CA, which addresses a column of the memory cell array 510. The address buffer 520 may transmit the row address RA to the row decoder 530 and the column address CA to the column decoder 540.

The row decoder 530 may select one of the word lines WL connected to the memory cell array 510. The row decoder 530 may decode the row address RA received from the address buffer 520, select a word line WL corresponding to the row address RA, and activate the word line WL.

The column decoder 540 may select some of the bit lines BL of the memory cell array 510. The column decoder 540 may generate a column selection signal by decoding the column address CA received from the address buffer 520 and select bit lines BL corresponding to the column selection signal through the I/O gating circuit 560.

The sense amplifier 550 may be connected to the bit lines BL of the memory cell array 510. The sense amplifier 550 may sense a voltage change of bit lines BL and amplify (and output) the voltage change. The bit lines BL sensed and amplified by the sense amplifier 550 may be selected through the I/O gating circuit 560.

The I/O gating circuit 560 may include read data latches, which store data of bit lines BL selected by a column selection signal, and a write driver, which writes data to the memory cell array 510. The data stored in the read data latches may be provided to a data pad DQ through the data I/O circuit 580. Data provided to the data I/O circuit 580 through the data pad DQ may be written to the memory cell array 510 through the write driver. The data pad DQ may be connected to a local bus (e.g., the local bus 430 in FIG. 11) of the memory 500.

The processing element 570 may be between the I/O gating circuit 560 and the data I/O circuit 580. The processing element 570 may perform a calculation operation based on data read from the memory cell array 510 or data received from the data I/O circuit 580. The data I/O circuit 580 and the processing element 570 may include (and/or be included in) hardware including logic circuits; a hardware/software combination such as a processor executing software; and/or a combination thereof. For example, the processing element 570 may include and/or be included in an arithmetic logic unit (ALU), a digital signal processor, a microcomputer, a field programmable gate array (FPGA), and programmable logic unit, a microprocessor, application-specific integrated circuit (ASIC), etc. The processing element 570 may write a calculation result to the memory cell array 510 and/or provide the calculation result to the data pad DQ through the data I/O circuit 580.

The control logic 590 may receive a clock signal CLK (and/or a command CMD), and generate control signals CTRLS for controlling the operation timing, a memory operation, and/or a calculation operation of the memory 500. The control logic 590 may read data from the memory cell array 510 and write data to the memory cell array 510 using the control signals CTRLS. The control logic 590 may also control the processing element 570 to perform a calculation process using the control signals CTRLS.

Although it is illustrated and described in the embodiment of FIG. 12 that the control logic 590 controls the memory operation and calculation operation of the memory 500, the example embodiments are not limited thereto. For example, the memory 500 may include a separate element, e.g., a processing controller, which generates control signal for controlling the calculation operation of the memory 500.

It is illustrated and described in the embodiment of FIG. 12 that the memory 500 includes the processing element 570, but the example embodiments are not limited thereto. For example, when there is no processing element connected to a bank, the processing element 570 may be omitted from the embodiment of FIG. 12.

Figure 13:
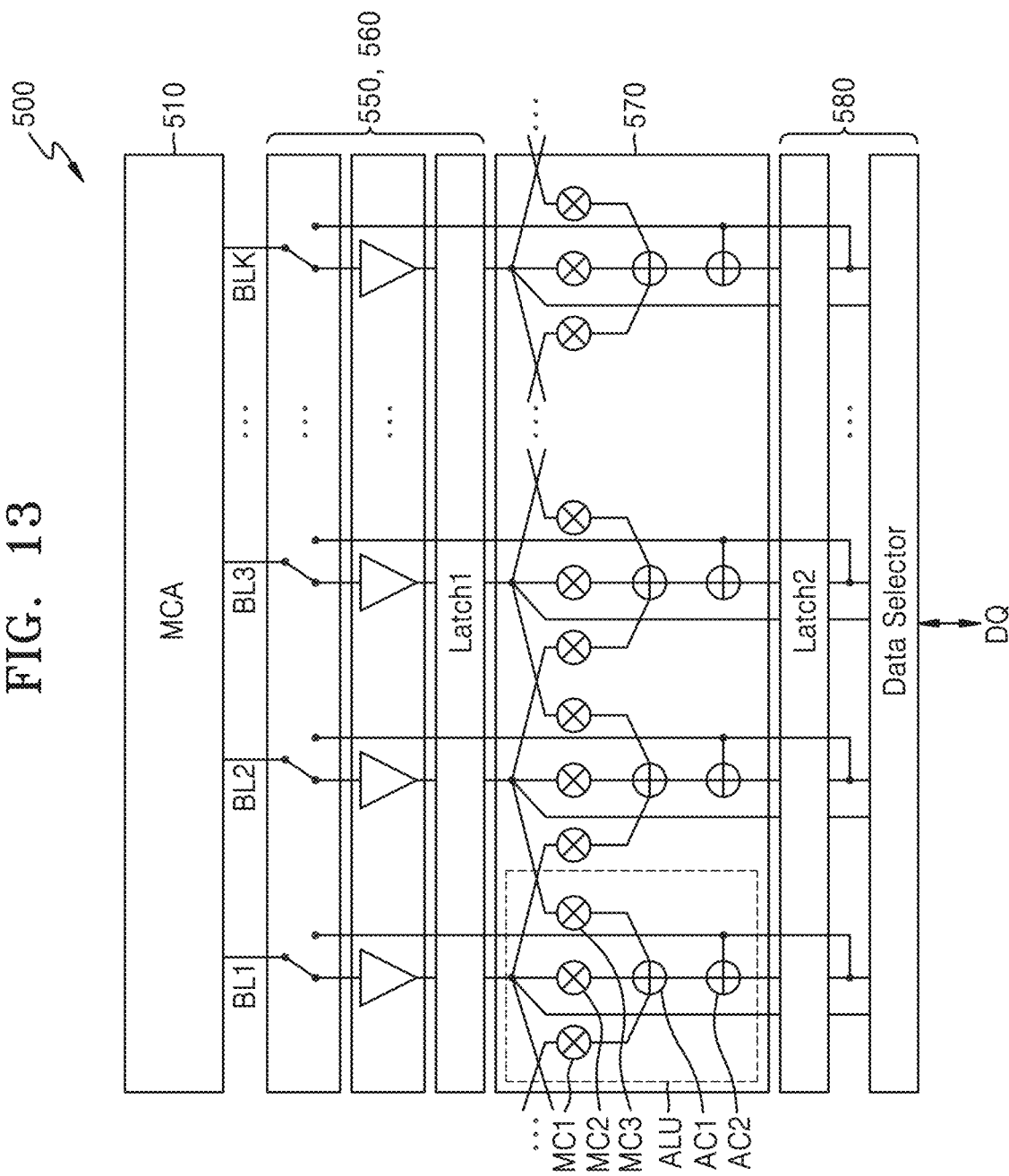
FIG. 13 is a detailed diagram illustrating the structure of the memory, according to some example embodiments.

FIG. 13 is a detailed diagram illustrating the structure of a memory, according to some example embodiments. In detail, FIG. 13 is a detailed diagram illustrating the structure of the memory 500 of FIG. 12. Hereinafter, redundant descriptions given above with reference to FIG. 12 are omitted.

Referring to FIGS. 12 and 13, the memory 500 may further include various elements related to a calculation operation. For example, the processing element 570 may include ALUs respectively corresponding to a plurality of bit lines BL1 through BLK of the memory cell array 510.

Each of the ALUs may include a plurality of multiplicity circuits (e.g., first through third multiplication circuits MC1, MC2, and MC3) and a plurality of addition circuits (first and second addition circuits AC1 and AC2). For example, the plurality of multiplication circuits (e.g., first through third multiplication circuits MC1, MC2, and MC3) may respectively perform multiplications of weights and pieces of data read from a corresponding bit line and adjacent bit lines and output a plurality of multiplication results.

For example, referring to FIG. 13, the second multiplication circuit MC2 may perform a multiplication of a second weight and data read from a bit line corresponding to an ALU and output a second multiplication result. The first multiplication circuit MC1 may perform a multiplication of a first weight and data read from a bit line on the left of the corresponding bit line and output a first multiplication result. The third multiplication circuit MC3 may perform a multiplication of a third weight and data read from a bit line on the right of the corresponding bit line and output a third multiplication result. In some example embodiments, the first through third weights may be the same as or different from each other. Data read from a corresponding bit line and adjacent bit lines may correspond to data stored in a read data latch Latch1 through the sense amplifier 550.

The first addition circuit AC1 may perform an addition of the first through third multiplication results of the first through third multiplication circuits MC1, MC2, and MC3 and output a first addition result. The second addition circuit AC2 may perform an addition of the first addition result and the data read from the corresponding bit line and output a second addition result. At this time, the data read from the corresponding bit line may correspond to data that is transmitted from the memory cell array 510 without passing through the sense amplifier 550 and the read data latch Latch1.

As described above, a calculation operation using an ALU is performed using data received from adjacent bit lines as well as data of a bit line corresponding to the ALU and may thus be applied to a convolution calculation. The method described above may be extended to an embodiment of receiving data from bit lines, which are adjacent to the corresponding bit line and included in different banks from each other.

In some example embodiments, an ALU, which is located in an edge of each of the first and second banks Bank1 and Bank2, adjacent to each other, among a plurality of ALUs of the first or second bank Bank1 or Bank2, may be connected to an ALU, which is located in an edge of an adjacent bank, through a data line. For example, an ALU in the right edge of the first bank Bank1 may be connected to an ALU in the left edge of the second bank Bank2 through a data line. The data line may connect the first (or third) multiplication circuit MC1 (or MC3) of each ALU to an adjacent bit line.

The data I/O circuit 580 may include a calculated data latch Latch2, which stores the second addition result output from the second addition circuit AC2, and a data selector, which selects data to be provided to the data pad DQ. The calculated data latch Latch2 may store the second addition result output from the second addition circuit AC2. In some example embodiments, the data selector may include at least one multiplexer.

Although FIGS. 12 and 13 illustrate the structure of a bank and a processing element that are connected to each other, the example embodiments are not limited thereto. For example, when a bank is not connected to a processing element, the processing element 570 in FIGS. 12 and 13 and the calculated data latch Latch2 of the data I/O circuit 580 may be omitted.

Figure 14:
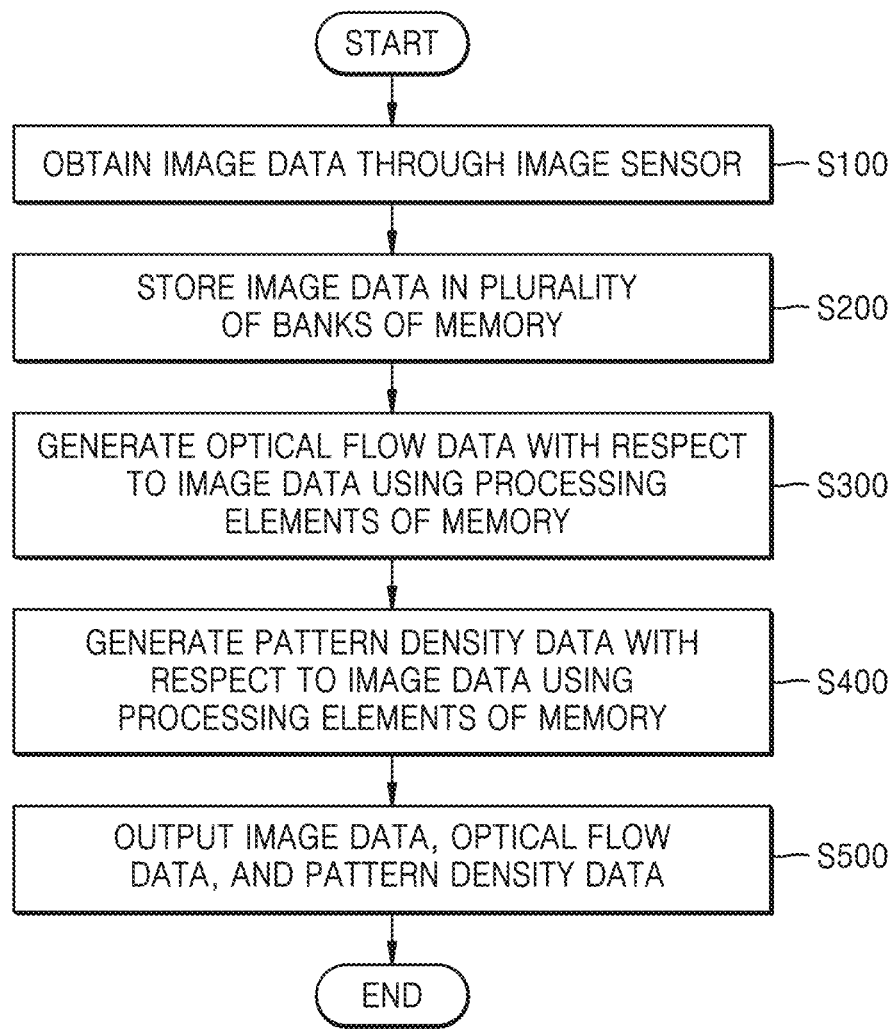
FIG. 14 is a flowchart of an operating method of an image sensor module, according to some example embodiments.

FIG. 14 is a flowchart of an operating method of an image sensor module, according to some example embodiments. The operating method of FIG. 14 may be, for example, performed using the image sensor module 100 in FIG. 1.

Referring to FIGS. 1 and 14, the image sensor module 100 may obtain image data (e.g., through the image sensor 110) in operation S100. The image sensor module 100 may store the image data (e.g., in a plurality of banks of the memory 120) in operation S200. In some example embodiments, the image sensor module 100 may divide the image data into a plurality of image regions and store the image regions in a plurality of banks. For example, the image sensor module 100 may store a first image region of the image data in a first bank and a second image region of the image data in a second bank.

The image sensor module 100 may generate optical flow data with respect to the image data, using processing elements of the memory 120, in operation S300. The image sensor module 100 may also generate pattern density data with respect to the image data, using the processing elements of the memory 120, in operation S400. In some example embodiments, the generating the optical flow data and/or the pattern density data may correspond to a neural network-based calculation processing operation.

The image sensor module 100 may output the image data, the optical flow data, and the pattern density data in operation S500. In some example embodiments, the image sensor module 100 may output the image data, the optical flow data, and the pattern density data to the image processing device 200. The image processing device 200 may perform object detection on the image data based on the optical flow data and the pattern density data.

Figure 15:
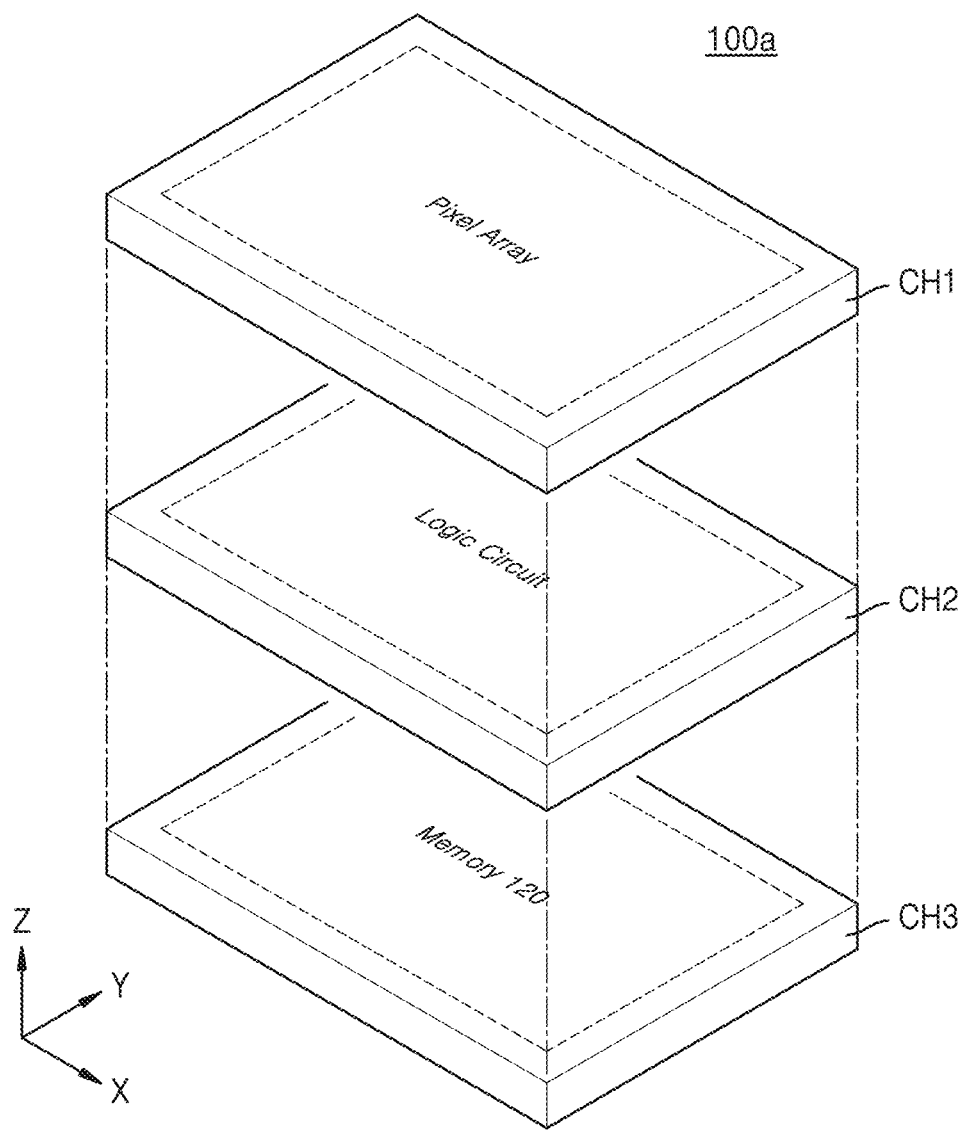
FIG. 15 is an exploded perspective view of an image sensor module.
Figure 16:
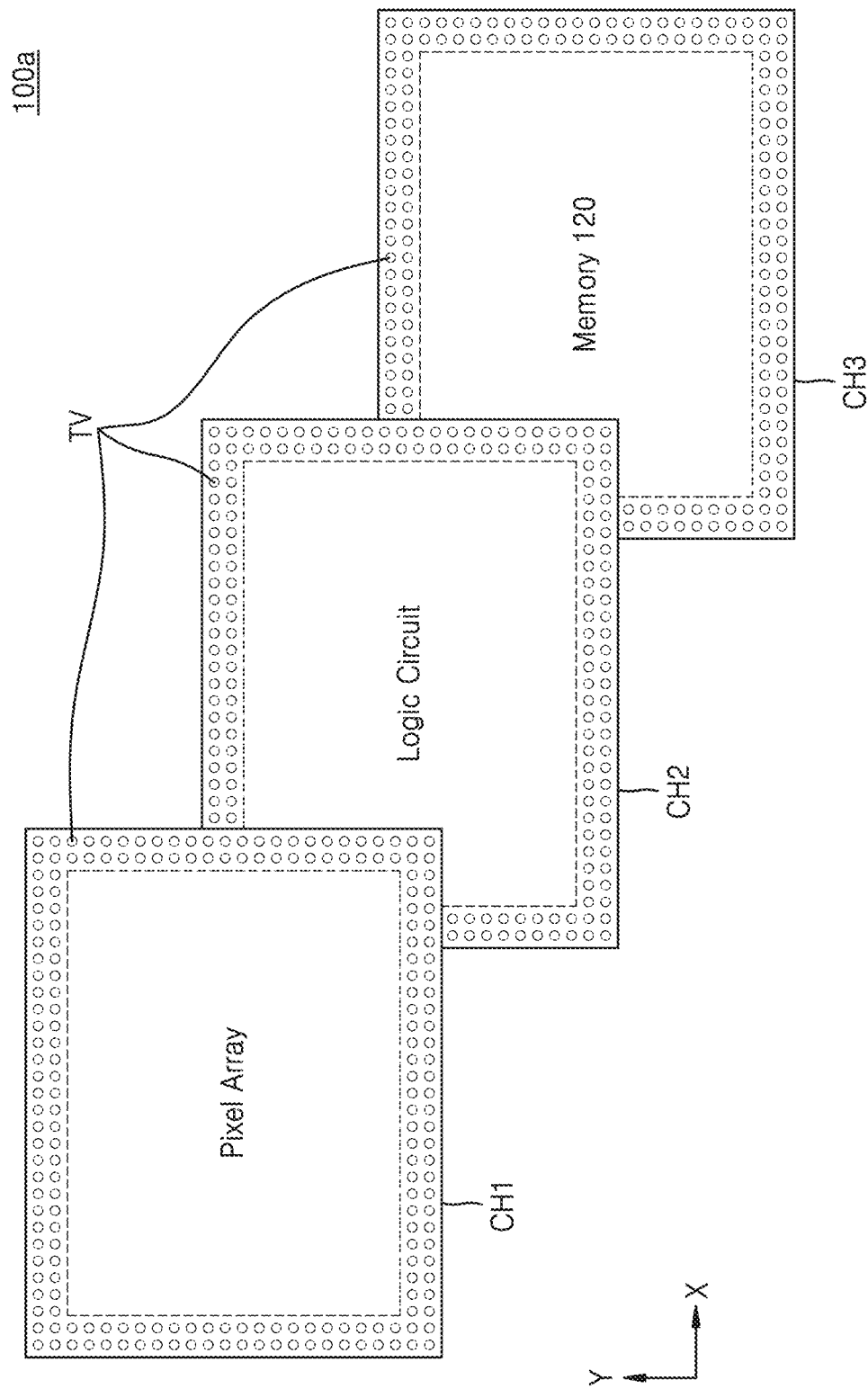
FIG. 16 is a plan view of the image sensor module.

FIG. 15 is an exploded perspective view of an image sensor module, and FIG. 16 is a plan view of the image sensor module. Referring to FIGS. 15 and 16, an image sensor module 100*a* may have a stack structure of a first chip CH1, a second chip CH2, and a third chip CH3. A pixel core (e.g., at least one photoelectric conversion element and a pixel circuit) of each of a plurality of pixels included in a pixel array of the image sensor 110 in FIG. 1 may be formed in the first chip CH1. A driver and read circuit including a logic circuit (e.g., a row driver, a readout circuit, a ramp generator, and/or a timing controller) may be formed in the second chip CH2. The memory 120 in FIG. 1 may be formed in the third chip CH3. The first through third chips CH1, CH2, and CH3 may be electrically connected to one another through a connecting member or a through via. However, the example embodiments are not limited thereto. For example, the image sensor module 100*a* may be implemented in a single semiconductor chip.

As shown in FIG. 16, the first through third chips CH1, CH2, and CH3 may respectively include a pixel array, a logic circuit, and the memory 120 in FIG. 1 in the central portions thereof and each include a peripheral region in the outer edge thereof.

Through vias TV extending in a third direction (e.g., a Z direction) may be arranged in the peripheral region of each of the first through third chips CH1, CH2, and CH3. The first chip CH1 may be electrically coupled to the second chip CH2 through the through vias TV. Wirings extending in a first direction (e.g., an X direction) or a second direction (e.g., a Y direction) may be formed in the peripheral region of each of the first through third chips CH1, CH2, and CH3.

Figure 17:
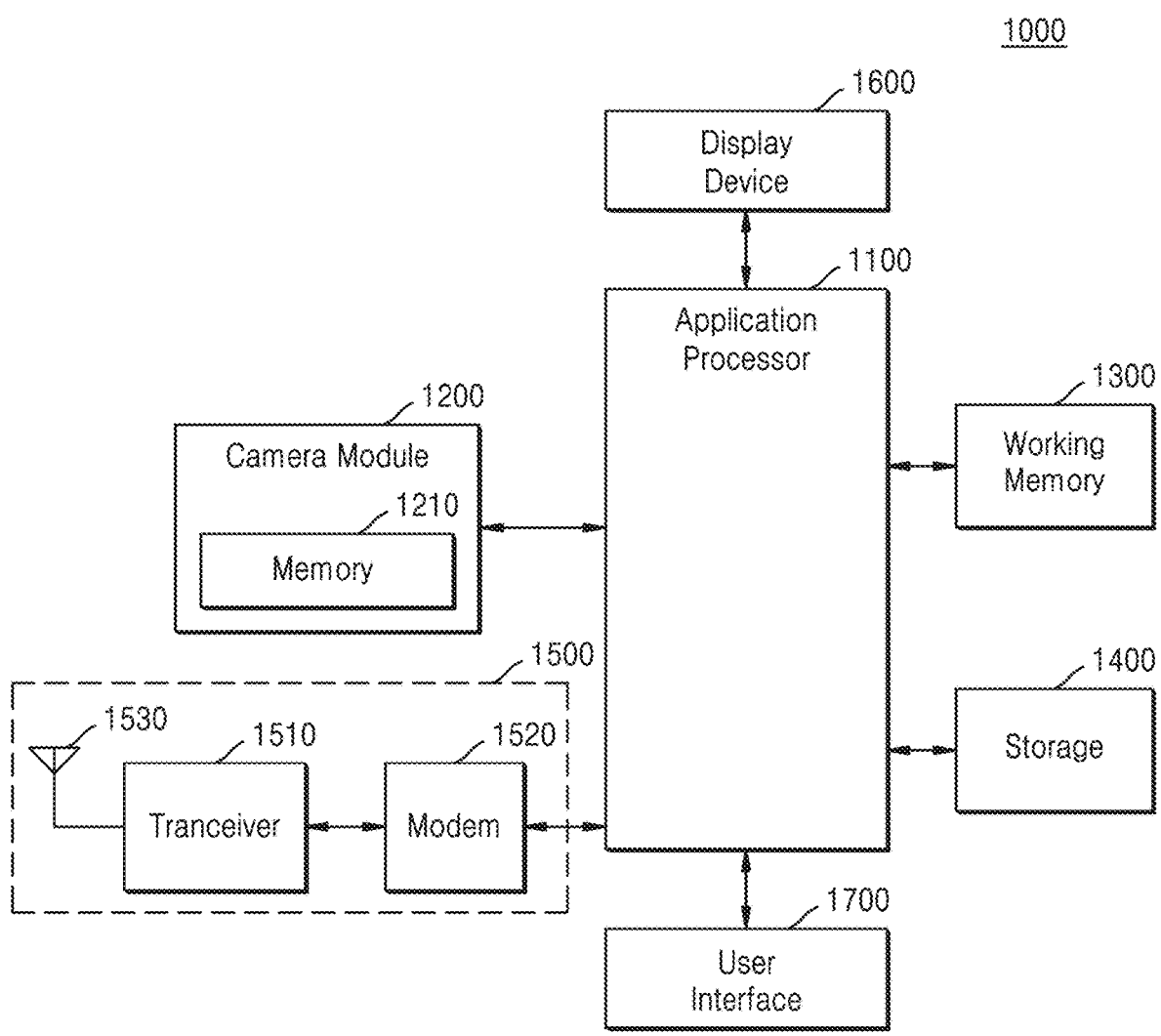
FIG. 17 is a block diagram of an electronic device according to some example embodiments.

FIG. 17 is a block diagram of an electronic device according to some example embodiments.

Referring to FIG. 17, an electronic device 1000 may include an application processor 1100, a camera module 1200, a working memory 1300, a storage 1400, a display device 1600, a user interface 1700, and a wireless transceiver 1500.

The application processor 1100 may include a system-on-chip (SoC), which generally controls operations of the electronic device 1000 and runs an application program, an operating system, and/or the like. The application processor 1100 may provide image data received from the camera module 1200 to the display device 1600 and/or store the image data in the storage 1400.

The image sensor module 100 described with reference to FIGS. 1 through 16 may be applied to the camera module 1200. The camera module 1200 may include a memory 1210 performing a calculation process. The memory 1210 may perform calculation processing (e.g., pattern density detection and optical flow detection) on image data, which is stored in a bank of the memory 1210, using a PIM circuit.

The processor 220, 220a, and/or 220b (described with reference to FIGS. 1 through 16) may be applied to the application processor 1100. The application processor 1100 may receive image data and calculation data (e.g., pattern density data and optical flow data) from the camera module 1200 and perform additional calculation processing (e.g., object detection) on the image data based on the calculation data. In an example embodiment, when the electronic device 1000 is an autonomous vehicle, the application processor 1100 may control the driving unit of the autonomous vehicle based on object information obtained by performing object detection.

The working memory 1300 may include volatile memory (such as DRAM or static RAM (SRAM)), and/or non-volatile resistive memory (such as FeRAM, RRAM, and/or PRAM). The working memory 1300 may store programs and/or data, which are processed or executed by the application processor 1100.

The storage 1400 may include non-volatile memory such as NAND flash memory and/or resistive memory. For example, the storage 1400 may be provided as a memory card such as a multimedia card (MMC), an embedded MMC (eMMC), a secure digital (SD) card, and/or a micro SD card. The storage 1400 may store image data received from the camera module 1200 or data processed or generated by the application processor 1100.

The user interface 1700 may include various devices, such as a keyboard, a button key panel, a touch panel, a fingerprint sensor, and a microphone, which may receive a user input. The user interface 1700 may receive a user input and provide a signal corresponding to the user input to the application processor 1100. Though illustrated as separate, in some embodiments, the display device 1600 and the user interface 1700 may be at least partially merged. For example, the display device 1600 and the user interface 1700 may be (and/or include) a touch screen.

The wireless transceiver 1500 may include a transceiver 1510, a modem 1520, and an antenna 1530.

While the inventive concepts have been particularly shown and described with reference to embodiments thereof, it will be understood that various changes in form and details may be made therein without departing from the spirit and scope of the following claims.

What is claimed is:

1. An image sensor module comprising:
   an image sensor configured to generate image data; and
   memory, including at least a memory bank storing the image data and a processor-in-memory (PIM) circuit, the PIM circuit including a plurality of processing elements, and the memory is configured to
   read the image data from the memory bank,
   generate optical flow data and pattern density data using the plurality of processing elements, the optical flow data indicating time-sequential motion of at least one object included in the image data, and the pattern density data indicating a density of a pattern of the image data, and
   output the image data, the optical flow data, and the pattern density data.

2. The image sensor module of claim 1, wherein the PIM circuit includes:
   first processing elements configured to generate the optical flow data; and
   second processing elements configured to generate the pattern density data.

3. The image sensor module of claim 2, wherein the PIM circuit includes a neural network module including the first processing elements and the second processing elements.

4. The image sensor module of claim 1, wherein the memory further includes:
   a local bus configured to transfer data between the memory bank and the plurality of processing elements.

5. The image sensor module of claim 1, wherein
   the image sensor module is configured to operate in at least one of a normal shooting mode or a burst shooting mode,
   the normal shooting mode generating a frame of image data in a reference time unit, and
   the burst shooting mode generating a plurality of frames of continuous image data in the reference time unit.

6. The image sensor module of claim 5, wherein
   the image sensor module is further configured to generate the continuous image data in the burst shooting mode, and
   the memory is further configured to generate the optical flow data based on the continuous image data.

7. An image processing system comprising:
   an image sensor module; and
   an image processing device,
   the image sensor module including
      an image sensor configured to generate image data, and
      memory configured to generate optical flow data and pattern density data using a processor-in-memory (PIM) circuit, the optical flow data indicating time-sequential motion of at least one object included in the image data, and the pattern density data indicating a density of a pattern of the image data, and
   the image processing device is configured to perform object detection on the image data based on the image data, the optical flow data, and the pattern density data.

8. The image processing system of claim 7, wherein
   the image processing device is further configured to generate depth information based on the optical flow data and the pattern density data, and
   the depth information indicates a distance between the image sensor module and the at least one object included in the image data.

9. The image processing system of claim 8, wherein the image processing device is further configured to perform the object detection on the image data using the depth information and the image data.

10. The image processing system of claim 9, wherein the image processing device includes a neural network module trained to generate the depth information based on the optical flow data and the pattern density data.

11. The image processing system of claim 9, wherein the image processing device includes a neural network module trained to perform the object detection based on the depth information and the image data.

12. The image processing system of claim 9, wherein the image processing device is further configured to:
   generate a plurality of pyramid images based on the image data, the plurality of pyramid images having different resolutions from each other;
   generate a plurality of pieces of feature data with respect to the plurality of pyramid images; and
   perform the object detection on the image data based on the plurality of pieces of feature data.

13. The image processing system of claim 12, wherein the image processing device is further configured to:

generate a plurality of pieces of mask data respectively corresponding to the plurality of pyramid images based on the depth information, generate a plurality of masked images by applying the plurality of pieces of mask data to the plurality of pyramid images, and generate the plurality of pieces of feature data based on the plurality of masked images.

14. The image processing system of claim 13, wherein the image processing device is further configured to:

identify depth values from the depth information, the depth values corresponding to a resolution of each of the plurality of pyramid images; and generate mask data based on the depth values.

15. The image processing system of claim 9, wherein the image sensor module further includes a first image sensor module and a second image sensor module, the first image sensor module is configured to generate first image data, first optical flow data, and first pattern density data, and the second image sensor module is configured to generate second image data, second optical flow data, and second pattern density data.

16. The image processing system of claim 15, wherein the image processing device is further configured to generate the depth information based on the first and second optical flow data and the first and second pattern density data.

17. The image processing system of claim 16, wherein the image processing device is further configured to perform the object detection on the first image data or the second image data based on the depth information.

18. The image processing system of claim 7, wherein the PIM circuit includes:

first processing elements configured to generate the optical flow data; and second processing elements configured to generate the pattern density data.

19. The image processing system of claim 18, wherein the PIM circuit includes:

a neural network model, and wherein the neural network model includes the first and second processing elements.

20. An operating method of a module including an image sensor and memory, the operating method comprising:

obtaining image data using the image sensor;

storing the image data in a plurality of banks included in the memory;

generating optical flow data with respect to the image data using processing elements included in the memory;

generating pattern density data with respect to the image data using the processing elements included in the memory; and outputting the image data, the optical flow data, and the pattern density data.

* * * * *